United States Patent
Kikuchi et al.

(10) Patent No.: US 9,800,810 B2
(45) Date of Patent: Oct. 24, 2017

(54) IMAGING APPARATUS AND IMAGING SYSTEM

(71) Applicant: CANON KABUSHIKI KAISHA, Tokyo (JP)

(72) Inventors: Shin Kikuchi, Kawasaki (JP); Kei Ochiai, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/236,234

(22) Filed: Aug. 12, 2016

(65) Prior Publication Data
US 2017/0054926 A1    Feb. 23, 2017

(30) Foreign Application Priority Data

Aug. 20, 2015  (JP) .................................. 2015-163159
Aug. 20, 2015  (JP) .................................. 2015-163160

(51) Int. Cl.
*H04N 5/378*    (2011.01)
*H04N 5/357*    (2011.01)
(Continued)

(52) U.S. Cl.
CPC .............. *H04N 5/359* (2013.01); *H03F 3/08* (2013.01); *H03F 3/45183* (2013.01); *H03F 3/45475* (2013.01); *H03G 11/002* (2013.01); *H04N 5/3575* (2013.01); *H04N 5/378* (2013.01); *H03F 2200/411* (2013.01); *H03F 2203/45026* (2013.01); *H03F 2203/45512* (2013.01);
(Continued)

(58) Field of Classification Search
CPC .... H04N 5/2351; H04N 5/3745; H04N 9/645; H04N 5/359; H04N 5/3575; H04N 5/378; H03F 3/08; H03F 3/45183; H03F 3/45475; H03F 2203/45512; H03F 2203/45536; H03F 2203/45544; H03F 2203/45618; H03F 2203/45674; H03G 11/002

See application file for complete search history.

(56) References Cited

U.S. PATENT DOCUMENTS 4,396,951 A * 8/1983 Tanaka ................. H04N 5/2351
                                                  348/245
5,889,557 A * 3/1999 Sato ....................... H04N 9/645
                                                  348/173
(Continued)

FOREIGN PATENT DOCUMENTS

JP    2007-201550 A    8/2007
JP    2012-253740 A    12/2012
(Continued)

*Primary Examiner* — Hung Lam
(74) *Attorney, Agent, or Firm* — Canon USA, Inc., IP Division

(57) ABSTRACT

One imaging apparatus includes a first amplifier circuit, a second amplifier circuit, and a limiter circuit that limits the output of the first amplifier circuit, and further includes a configuration to clamp the output of the limiter circuit. Moreover, another imaging apparatus includes a fully differential amplifier circuit that outputs an amplified noise signal amplified from a noise signal, and an amplified optical signal amplified from an optical signal, and an output limiting circuit that limits each of the amplitude range of the amplified noise signal and the amplitude range the amplified optical signal.

16 Claims, 22 Drawing Sheets

(51) Int. Cl.
*H04N 5/359* (2011.01)
*H03F 3/45* (2006.01)
*H03G 11/00* (2006.01)
*H03F 3/08* (2006.01)

(52) U.S. Cl.
CPC .............. *H03F 2203/45536* (2013.01); *H03F 2203/45544* (2013.01); *H03F 2203/45618* (2013.01); *H03F 2203/45674* (2013.01); *H03F 2203/45728* (2013.01)

(56) References Cited

U.S. PATENT DOCUMENTS

| | | | | |
|---|---|---|---|---|
| 5,955,918 | A * | 9/1999 | Uno | ........................ H03F 3/087 327/307 |
| 7,102,447 | B2 * | 9/2006 | Mattisson | ................ H03B 5/04 257/275 |
| 8,259,196 | B2 * | 9/2012 | Yoshikawa | .......... H03K 5/2481 348/222.1 |
| 2008/0252787 | A1 * | 10/2008 | Nakazawa | .......... H03M 1/0607 348/572 |
| 2013/0229557 | A1 * | 9/2013 | Hashimoto | .......... H04N 5/3745 348/301 |

FOREIGN PATENT DOCUMENTS

| | | | |
|---|---|---|---|
| JP | 2012-257029 A | 12/2012 | |
| JP | 2013-138328 A | 7/2013 | |
| JP | 2014-212423 A | 11/2014 | |
| WO | 2010/103580 A1 | 9/2010 | |

* cited by examiner

FIG. 19A
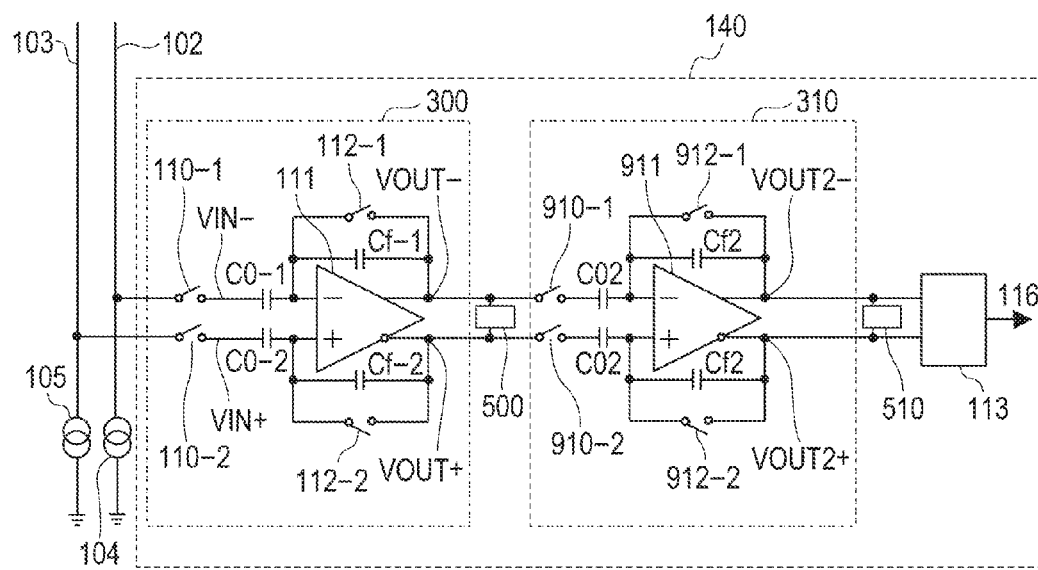
FIG. 19B
FIG. 19C
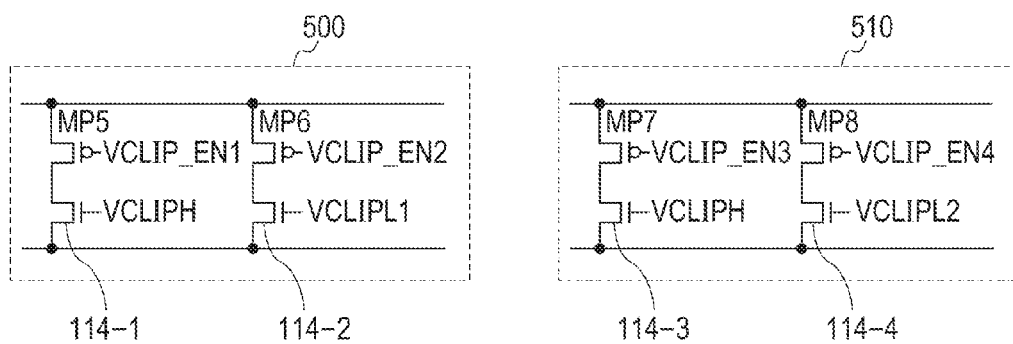

IMAGING APPARATUS AND IMAGING SYSTEM

BACKGROUND OF THE INVENTION

Field of the Invention

One disclosed aspect of the embodiments relates to an imaging apparatus and an imaging system.

Description of the Related Art

An imaging apparatus typically includes a photoelectric conversion portion, region, or circuit, that generates electric charge by photoelectrically converting incident light, and a floating diffusion portion, region, or circuit, that accumulates the electric charge, in which a pixel outputs an optical signal based on the potential of the floating diffusion portion. Furthermore, a configuration including an amplification portion, region, or circuit, that amplifies the optical signal output by the pixel is known as an example of the imaging apparatus.

In an imaging apparatus described in Japanese Patent Laid-Open No. 2012-257029, a multi-stage amplification portion amplifies an optical signal output by a pixel. Specifically, the first stage of the amplification portion amplifies an optical signal output by a pixel, and the second stage of the amplifier amplifies the signal amplified by the first stage of the amplification portion.

Moreover, in the imaging apparatus, the blackening phenomenon in which a portion having a large amount of light, which should be originally expressed as white that is highly bright, is reduced in brightness or blackens may happen when a subject having a large amount of light is photographed.

Japanese Patent Laid-Open No. 2014-212423 describes a configuration, including a limiter circuit that limits the output of an amplification portion that amplifies an optical signal output by a pixel, to reduce the blackening phenomenon.

Moreover, Japanese Patent Laid-Open No. 2007-201550 describes a configuration including a first amplifier circuit and a second amplifier circuit connected to an output node of the first amplifier circuit, the configuration including a limiter that limits the output of the first amplifier circuit and a limiter that limits the output of the second amplifier circuit.

Moreover, an imaging apparatus is known which includes an effective pixel that outputs a signal based on electric charge generated by photoelectric conversion, and a reference pixel that outputs a reference signal without performing photoelectric conversion.

As such an imaging apparatus, there is an imaging apparatus described in Japanese Patent Laid-Open No. 2012-253740. Japanese Patent Laid-Open No. 2012-253740 describes the imaging apparatus in which a fully differential amplifier circuit outputs a signal amplified from a difference between a signal output by the effective pixel and a signal output by the reference pixel.

SUMMARY OF THE INVENTION

One disclosed aspect of the embodiments has been made considering the above problems, and one aspect thereof is an imaging apparatus including a pixel having an amplifier transistor configured to output a noise signal and an optical signal based on light; an amplification portion, region, or circuit, into which the noise signal and the optical signal are input from the amplifier transistor; and a limiter circuit. The amplification portion, region, or circuit, has a first and a second amplifier circuit, the first amplifier circuit outputs, to the second amplifier circuit, a first reference signal amplified from the noise signal, and a first optical signal amplified from the optical signal, and the second amplifier circuit has a capacitive element and an amplifier. The limiter circuit is connected to an output node of the first amplifier circuit to limit the amplitude of the first reference signal output by the first amplifier circuit. The capacitive element is provided on an electric path between the limiter circuit and an input node of the amplifier. The capacitive element clamps the first reference signal whose amplitude is limited by the limiter circuit.

Moreover, another aspect is an imaging apparatus including a pixel having an amplifier transistor configured to output a noise signal and an optical signal based on light; a fully differential amplifier circuit into which the optical signal is input; and an output limiting circuit. The fully differential amplifier circuit has a first and a second output node, outputs an amplified noise signal amplified from the noise signal from the first and second output nodes, and outputs an amplified optical signal amplified from the optical signal from the first and second output nodes. The output limiting circuit is configured to limit: (1) the amplitudes of signals output to the first and second output nodes of the fully differential amplifier circuit, (2) the amplitude of the amplified noise signal to a first amplitude range, and (3) the amplitude of the amplified optical signal to a second amplitude range wider than the first amplitude range.

Further features of the disclosure will become apparent from the following description of exemplary embodiments (with reference to the attached drawings).

BRIEF DESCRIPTION OF THE DRAWINGS

FIGS. 19A, 19B, and 19C are a diagram illustrating an example of the configuration of the column circuit and diagrams illustrating examples of the configuration of the output limiting circuit.

DESCRIPTION OF THE EMBODIMENTS

Upon photographing a subject having a large amount of light, the amplitude of a noise signal output by a pixel may increase due to the leakage of electric charge from a photoelectric conversion portion, region, or circuit, into a floating diffusion portion, region, or circuit. In this case, the output of a first amplifier circuit into which the noise signal is input (let the output be a first reference signal) changes from a reset level to a level limited by a limiter circuit. In this case, a second amplifier circuit outputs a second reference signal amplified from the first reference signal that has changed to a level limited by the limiter circuit. Therefore, the second reference signal occupies a predetermined amplitude range of the range of amplitudes that can be taken by the output of the second amplifier circuit. Furthermore, the first amplifier circuit outputs, to the second amplifier circuit, a first optical signal amplified from an optical signal output by the pixel. Furthermore, the second amplifier circuit outputs a second optical signal amplified from the first optical signal. The second reference signal occupies a predetermined amplitude range of the range of amplitudes that can be taken by the output of the second amplifier circuit. Accordingly, the range of amplitudes that can be taken by the second optical signal is reduced. Consequently, the dynamic range of an image generated using the second optical signal is reduced.

A part of embodiments described below provides a technology for preventing a reduction in dynamic range caused by the second reference signal having the predetermined amplitude range.

Embodiments are described hereinafter with reference to the drawings.

First Embodiment

Figure 1:
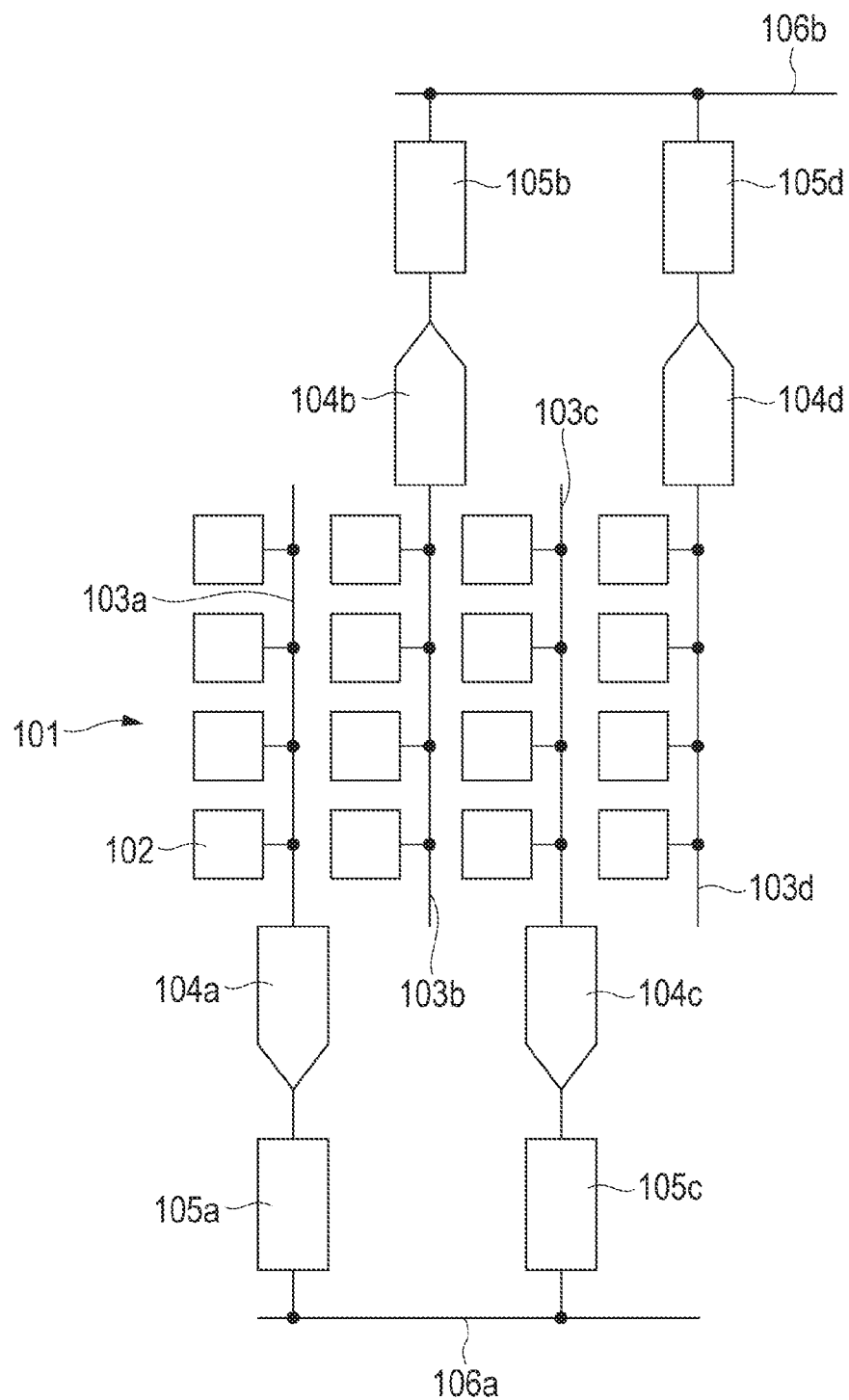
FIG. 1 is a diagram illustrating an example of the configuration of an imaging apparatus.

FIG. 1 illustrates a block diagram of an imaging apparatus of one embodiment. Pixels 102 are placed in matrix form in an imaging area 101. A plurality of pixel columns is placed to constitute the imaging area. Vertical signal lines 103a to 103d are placed respectively for the pixel columns. Signals of pixel rows are read out substantially simultaneously by their corresponding vertical signal lines 103a to 103d. In other words, it can be said that the signals are read out in parallel. Column amplification portions or circuits 104a to 104d are configured to be capable of amplifying signals output to the vertical signal lines 103a to 103d in two amplification stages. Sample-and-hold circuits 105a to 105d sample the signals amplified by the column amplification portions 104a to 104d. The signals held by the sample-and-hold circuits 105a to 105d are output to horizontal output lines 106a and 106b on a sequential or random basis in response to drive signals from an unillustrated horizontal scan circuit. All the circuits and blocks are preferably placed on the same semiconductor substrate. At least the imaging area 101 and the column amplification portions 104a to 104d are required to be placed on the same semiconductor substrate. Moreover, column AD conversion circuits may be placed downstream of the column amplification portions 104a to 104d. The column AD conversion circuits are also placed on the same semiconductor substrate. The column amplification portions 104a to 104d and the sample-and-hold circuits 105a to 105d can be called the column circuit. The column circuit is a circuit that can perform parallel processing in time on signals read out in parallel in time to a plurality of vertical signal lines.

Various configurations can be used as the configuration of the pixel. It is preferable to use, for example, what is called an APS sensor including a photoelectric conversion portion, region, or circuit and a pixel amplification portion, region, or circuit that amplifies a signal generated by the photoelectric conversion portion since the signal-to-noise ratio can be improved.

Figure 2:
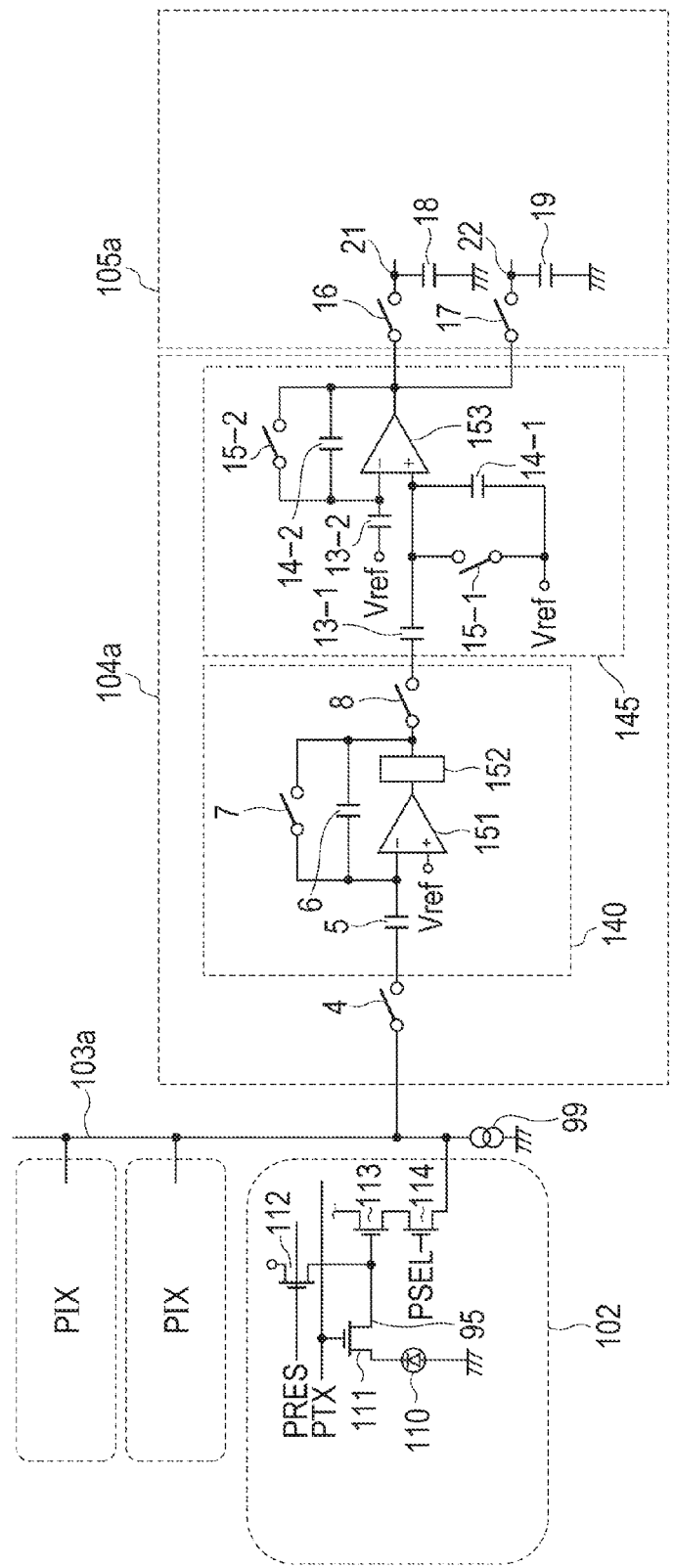
FIG. 2 is a diagram illustrating an example of the configuration of the imaging apparatus.

FIG. 2 is a diagram illustrating the detailed configuration of the imaging apparatus illustrated in FIG. 1. FIG. 2 illustrates a single column of the column circuit illustrated in FIG. 1, the single column including the column amplification portion 104a and the sample-and-hold circuit 105a, and its corresponding column of the pixels 102.

Firstly, the pixel 102 is described. The pixel 102 includes a photodiode 110, a transfer transistor 111, a reset transistor 112, an amplifier transistor 113, and a select transistor 114. The photodiode 110 receives incident light and generates electric charge by photoelectric conversion. In the embodiment, the electric charge generated by the photodiode 110 is an electron. The transfer transistor 111, the reset transistor 112, and the amplifier transistor 113 are connected via an FD 95. The FD 95 is a floating diffusion portion, region, or circuit. The floating diffusion portion converts electric charge transferred by the transfer transistor 111 from the photodiode 110 into a voltage based on a capacitance value of the floating diffusion portion. The amplifier transistor 113 is connected to the vertical signal line 103a via the select transistor 114. A current source 99 is connected to the vertical signal line 103a. When the select transistor 114 is turned on, the current source 99 and the amplifier transistor 113 form a source follower circuit. The amplifier transistor 113 outputs a signal based on the potential of the FD 95 being the floating diffusion portion. The reset transistor 112 resets the potential of the FD 95 when turned on. A signal that is output by the amplifier transistor 113 to the vertical signal line 103a via the select transistor 114 based on the reset potential of the FD 95 is expressed as the reference signal. The reference signal is a noise signal. On the other hand, a signal that is output by the amplifier transistor 113 based on the potential of the FD 95 to which the electric charge generated by the photodiode 110 has been transferred is expressed as the optical signal. A signal that is output by the pixel 102 is expressed as the pixel signal. The pixel signal includes the noise signal and the optical signal.

An unillustrated vertical scan circuit inputs a signal PTX into the transfer transistor 111. Moreover, the unillustrated vertical scan circuit inputs a signal PRES into the reset transistor 112. Moreover, the unillustrated vertical scan circuit inputs a signal PSEL into the select transistor 114.

Next, the column amplification portion 104a is described. The column amplification portion 104a includes a first amplifier circuit 140, a second amplifier circuit 145, and a switch 4. The first amplifier circuit 140 includes a capacitive element 5, a capacitive element 6, a switch 7, a switch 8, a first amplifier 151, and a limiter circuit 152. Moreover, the second amplifier circuit 145 includes a capacitive element 13-1, a capacitive element 13-2, a capacitive element 14-1, a capacitive element 14-2, a switch 15-1, a switch 15-2, and a second amplifier 153. A reference voltage Vref is input into a non-inverting input node of the first amplifier 151, one of input nodes of the capacitive element 13-2, and one of input nodes of the capacitive element 14-1. The first amplifier circuit 140 is an inverting amplifier circuit. The second amplifier circuit 145 is a non-inverting amplifier circuit. The capacitive element 13-1 is provided on an electric path between the limiter circuit 152 and an input node of the second amplifier 153.

Next, the sample-and-hold circuit 105a is described. The sample-and-hold circuit 105a includes a switch 16, a switch 17, a capacitive element 18, and a capacitive element 19. An output switch into which a control signal from the unillustrated horizontal scan circuit is input is provided downstream of each of the capacitive elements 18 and 19. The horizontal scan circuit sequentially selects output switches of the column circuit to output signals held by the capacitive elements 18 and 19 of the column circuit from the capacitive elements 18 and 19 to the horizontal output line 106a.

Figure 3:
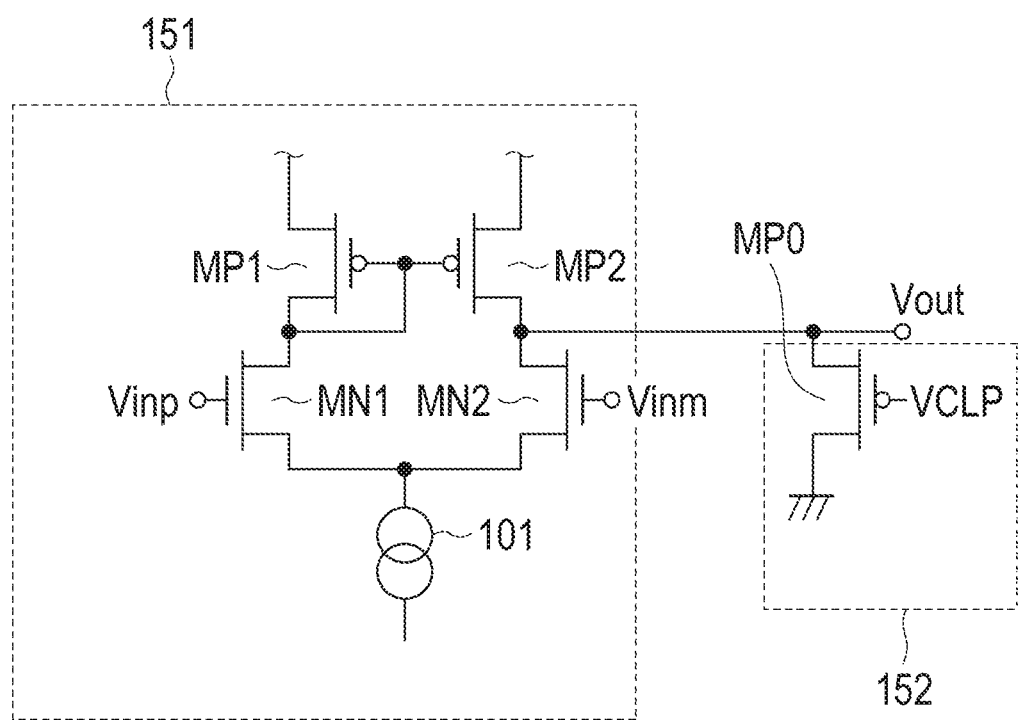
FIG. 3 is a diagram illustrating an example of the configuration of an amplifier and a limiter circuit of a first amplifier circuit.

FIG. 3 is a diagram illustrating the first amplifier and the limiter circuit 152 of the first amplifier circuit 140. The first amplifier includes an NMOS transistor MN1, an NMOS transistor MN2, a PMOS transistor MP1, a PMOS transistor MP2, and a current source 101. A signal output from the vertical signal line 103a is input as an input Vinp into a gate of the NMOS transistor MN1 via the capacitive element 5. Moreover, the voltage Vref is input as an input Vinm into a gate of the NMOS transistor MN2.

The limiter circuit 152 includes a PMOS transistor MP0. A potential VCLP is input into a gate of the PMOS transistor MP0. A source of the PMOS transistor MP0 is connected to an output node of the amplifier 101. A drain of the PMOS transistor MP0 is connected to a ground line. While the predetermined potential VCLP is being input into the gate of the PMOS transistor MP0, a voltage Vgs between the gate and the source of the PMOS transistor MP0 increases with the increasing potential of the output node of the VCLP amplifier 101. When the voltage Vgs becomes higher than a threshold voltage Vth of the PMOS transistor MP0, the PMOS transistor MP0 is put in operation. The operation of the PMOS transistor MP0 causes the limiter circuit 152 to limit the output of the first amplifier circuit 140.

Figure 4:
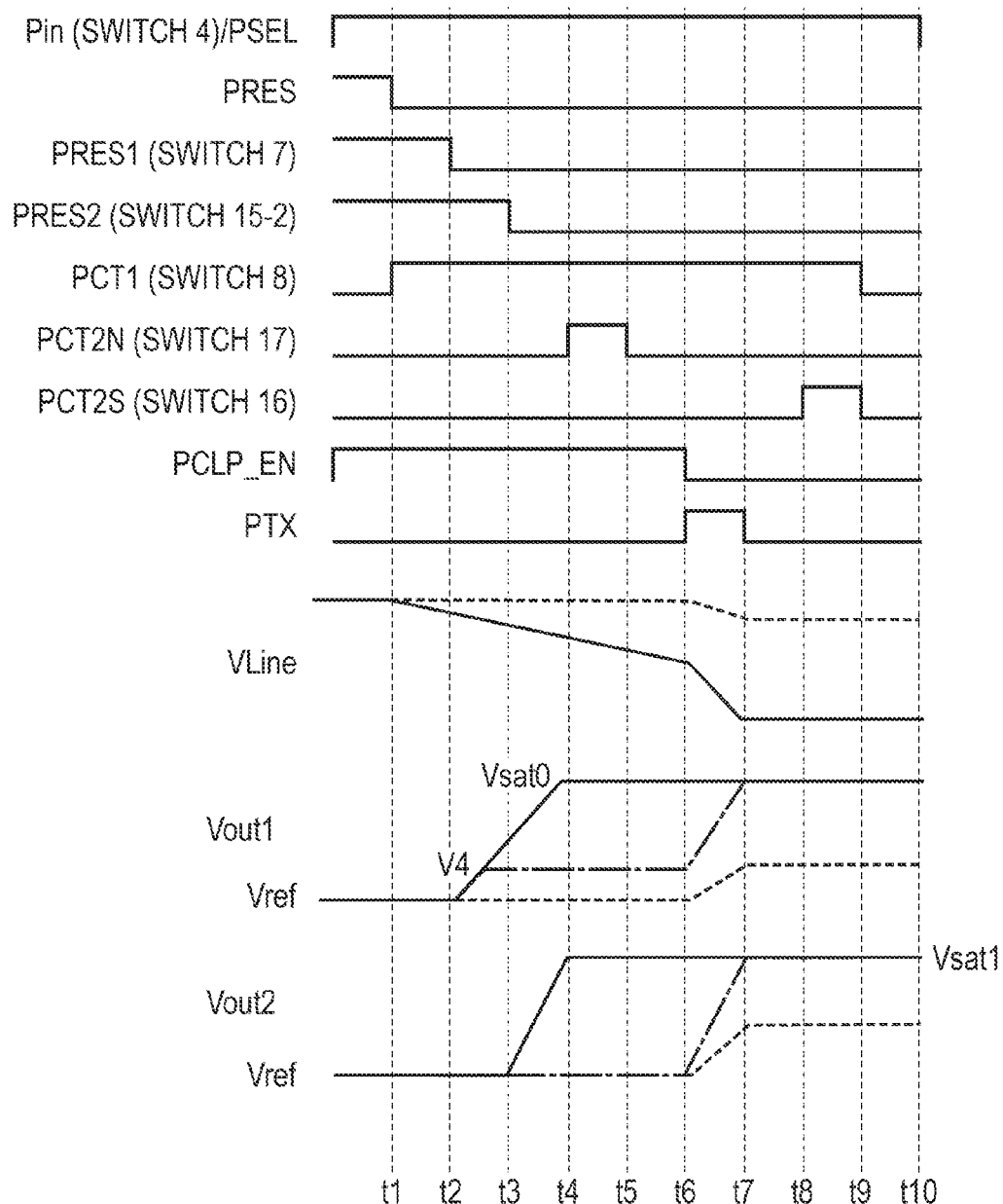
FIG. 4 is a diagram illustrating an example of the operation of the imaging apparatus.

FIG. 4 is a timing chart illustrating the operation of the circuit illustrated in FIG. 2. PSEL, PRES, and PTX, which are illustrated in FIG. 4, correspond to the signals illustrated in FIG. 2, respectively. Moreover, a signal Pin illustrated in FIG. 4 is a signal that is input into the switch 4. The signal Pin and the signal PSEL are synchronous in the embodiment. Moreover, a signal PRES1 illustrated in FIG. 4 is a signal that is input into the switch 7. A signal PRES2 is a signal that is input into the switch 15-2. Moreover, a signal PCT1 is a signal that is input into the switch 8. A signal PCT2N is a signal that is input into the switch 17. A signal PCT2S is a signal that is input into the switch 16. The transistor or switch into which each signal illustrated in FIG. 4 is input is turned on when a High level (hereinafter expressed as Hi level) signal is input, and is turned off when a Low level (hereinafter expressed as Lo level) signal is input.

VLine illustrated in FIG. 4 is the potential of the vertical signal line 103a. Moreover, Vout1 illustrated in FIG. 4 indicates the output of the first amplifier 151. Moreover, Vout2 illustrated in FIG. 4 indicates the output of the second amplifier 153.

At time t1, the unillustrated vertical scan circuit sets the signal level of the signal PSEL to the Hi level, and the signal level of the signal PTX to the Lo level. The unillustrated vertical scan circuit changes the signal level of the signal PRES from the Hi level to the Lo level, and cancels the reset of the FD 95. Consequently, the amplifier transistor 113 outputs the reference signal to the vertical signal line 103a.

In the potential VLine illustrated in FIG. 4, a solid line represents a potential of a case where the photodiode 110 receives light from a high brightness subject. On the other hand, a broken line represents a potential of a case where the photodiode 110 receives light from a low to intermediate brightness subject.

In the outputs Vout1 and Vout2, broken lines represent a potential of a case where the photodiode 110 receives light from a low to intermediate brightness subject. Moreover, in the outputs Vout1 and Vout2, dot-and-dash lines represent a potential of a case where the photodiode 110 receives light from a high brightness subject when the limiter circuit 152 operates. Moreover, in the outputs Vout1 and Vout2, solid lines represent a potential of a case where the photodiode 110 receives light from a high brightness subject when the limiter circuit 152 does not operate.

The potential of the potential VLine of the case where the photodiode 110 receives light from a high brightness subject is described again. When the photodiode 110 receives light from the high brightness subject, electric charge generated by the photodiode 110 leaks to the FD 95. The leakage of electric charge makes the potential of the FD 95 to decrease. Consequently, the potential of a signal output by the amplifier transistor 113 also decreases. Accordingly, the potential VLine decreases. In other words, the amplitude of the reference signal increases with the passage of time.

At time t1, an unillustrated control circuit sets the signal level of the signal PRES1 to the Hi level. Hence, even if the potential VLine changes, a change does not occur in the output Vout1 since the first amplifier circuit 140 has been reset.

At time t2, the unillustrated control circuit changes the signal level of the signal PRES1 from the Hi level to the Lo level. Consequently, the reset of the first amplifier circuit 140 is canceled. Hence, the first amplifier circuit 140 outputs a signal that has been inverted and amplified from the reference signal at an amplification factor expressed in the capacitance value of the capacitive element 5/the capacitance value of the capacitive element 6.

The first amplifier circuit 140 of the embodiment includes the limiter circuit 152. A case where the limiter circuit is put in non-operation is described here.

The reset of the first amplifier circuit 140 has been canceled. Accordingly, the potential of the output Vout1 of the first amplifier circuit 140 increases with decreasing potential VLine. In other words, the amplitude of the output Vout1 of the first amplifier circuit 140 also increases with the increasing amplitude of the reference signal. The output Vout1 of the first amplifier circuit 140 corresponding to the amplitude of the reference signal is a first reference signal amplified from the reference signal. In the example illustrated in FIG. 4, at time t4, the first reference signal reaches a potential Vsat0 that is at a saturation level of the output of the first amplifier circuit 140.

Next, at time t3, the unillustrated control circuit changes the signal level of the signal PRES2 from the Hi level to the Lo level. Consequently, the reset of the second amplifier circuit 145 is canceled. At this point in time, the capacitive element 13-1 clamps the output Vout1 of the first amplifier circuit 140. A difference signal being a signal of a difference between the signal clamped by the capacitive element 13-1 and a first optical signal is input into the second amplifier circuit 145. The amplitude of the output Vout2 of the second amplifier circuit 145 also increases with the increasing amplitude of the output Vout1 of the first amplifier circuit 140. The output Vout2 of the second amplifier circuit 145 is a second reference signal amplified from the output Vout1 of the first amplifier circuit 140 being the first reference signal. In response to at time t4, the first reference signal reaching the potential Vsat0 that is at the saturation level, the potential of the second reference signal reaches a potential Vsat1 that is at the saturation level of the output of the second amplifier circuit 145.

Next, at time t4, the unillustrated control circuit changes the signal level of the signal PCT2N from the Lo level to the Hi level. The unillustrated control circuit then changes the signal level of the signal PCT2N from the Hi level to the Lo level at time t5. Consequently, the capacitive element 19 holds the potential of the output Vout2. Consequently, the capacitive element 19 holds the second reference signal being the signal output by the second amplifier circuit 145.

At time t6, the unillustrated vertical scan circuit changes the signal level of the signal PTX from the Lo level to the Hi level. Consequently, the electric charge generated by the photodiode 110 starts being transferred to the FD 95. At time t7, the unillustrated vertical scan circuit changes the signal level of the signal PTX from the Hi level to the Lo level. Consequently, the transfer of the electric charge generated by the photodiode 110 to the FD 95 ends. Consequently, the potential of the FD 95 becomes a potential based on the electric charge generated by the photodiode 110 by photoelectrically converting incident light. The amplifier transistor 113 outputs a signal based on the potential of the FD 95 to the vertical signal line 103a via the select transistor 114. The signal output by the amplifier transistor 113 is the optical signal.

After receiving the optical signal output by the amplifier transistor 113, the first amplifier circuit 140 outputs, to the second amplifier circuit, a signal amplified from the optical signal. The signal amplified from the optical signal and output by the first amplifier circuit 140 is the first optical signal. In terms of the first optical signal, the signal level of the first reference signal has already reached the potential Vsat0 that is at the saturation level, and accordingly the signal level of the first optical signal is also the potential Vsat0 that is at the saturation level.

The second amplifier circuit 145 outputs a signal amplified from the first optical signal amplified by the first amplifier circuit 140. The signal output by the second amplifier circuit 145 is a second optical signal amplified from the first optical signal. In terms of the second optical signal, the signal level of the second reference signal has reached the potential Vsat1 that is at the saturation level of the second amplifier circuit 145, and accordingly the signal level of the second optical signal is also the potential Vsat1 that is at the saturation level.

At time t8, the unillustrated control circuit changes the signal level of the signal PCT2S from the Lo level to the Hi level. Consequently, the capacitive element 18 samples the second optical signal.

At time t9, the unillustrated control circuit changes the signal level of the signal PCT2S from the Hi level to the Lo level. Consequently, the capacitive element 18 holds the second optical signal.

At time t10, the unillustrated vertical scan circuit changes the signal level of the signal PSEL from the Hi level to the Lo level. The unillustrated control circuit then changes the signal level of the signal PSEL that is output to the pixel 102 in another row from the Lo level to the Hi level. The above operations are subsequently repeated. Accordingly, the reference signals and optical signals output by the pixels 102 in each row are read out.

As described above, when the limiter circuit 152 included in the first amplifier circuit 140 is put in non-operation, the amplitude of the first reference signal increases in accordance with the leakage of electric charge from the photodiode 110 to the FD 95. Therefore, when a CDS process is performed which obtains a difference between the second reference signal held by the capacitive element 19 and the second optical signal held by the capacitive element 18, the amplitude of the second optical signal after the CDS process becomes smaller than the original amplitude corresponding to the amount of incident light. In the example illustrated in FIG. 4, both of the second reference signal and the second optical signal are at the signal level of the potential Vsat1. Hence, Vsig obtained by subtracting the second reference signal from the second optical signal is:

$$Vsig = Vsat1 - Vsat1 = 0 \quad (1)$$

Therefore, the blackening phenomenon occurs in which a portion that should be originally shown as white as an image appears black and sunk.

Next, a case where the limiter circuit 152 is operated is described. The unillustrated control circuit sets the signal level of a signal PCLP_EN to the Hi level prior to time t1. Consequently, the limiter circuit 152 that receives the signal PCLP_EN is in an operable state.

When the reset of the first amplifier circuit 140 is canceled at time t2, the amplitude of the first reference signal increases with the increasing amplitude of the reference signal. However, when the potential Vref has changed to a potential V4, the limiter circuit 152 limits the output of the first amplifier circuit 140. Consequently, even if the amplitude of the reference signal increases, the signal level of the first reference signal is limited unchanged at the potential V4 until the signal level of the signal PCLP_EN changes from the Hi level to the Lo level at time t6.

The second amplifier circuit 145 is reset until the signal level of the signal PRES2 changes from the Hi level to the Lo level at time t3. Also at a time when the signal level of the first reference signal changes from the potential Vref to the potential V4, the second amplifier circuit 145 is still reset. Therefore, even if the signal level of the first reference signal changes from the potential Vref to the potential V4, the signal level of the second reference signal does not change.

At time t3, the unillustrated control circuit changes the signal level of the signal PRES2 from the Hi level to the Lo level. Consequently, the reset of the second amplifier circuit 145 is canceled. Moreover, the capacitive element 13-1 clamps the output of the limiter circuit 152. A difference signal being a signal of a difference between an output signal of the limiter circuit 152 clamped by the capacitive element 13-1 and the first optical signal is input into the second amplifier circuit 145. The second amplifier circuit 145 amplifies the difference signal to generate the second optical signal.

Moreover, the signal level of the first reference signal is limited unchanged at the potential V4 until time t6. Therefore, the signal level of the second reference signal also remains at the potential Vref until time t6.

At time t5, the signal level of the signal PCT2N changes from the Hi level to the Lo level. Consequently, the capacitive element 19 holds the second reference signal that is at the signal level of the potential Vref.

At time t6, the unillustrated control circuit changes the signal level of the signal PCLP_EN from the Hi level to the Lo level. Consequently, the limit of the output of the first amplifier circuit 140 by the limiter circuit 152 is canceled. Moreover, at time t6, the unillustrated vertical scan circuit changes the signal level of the signal PTX from the Lo level to the Hi level. The unillustrated vertical scan circuit then changes the signal level of the signal PTX from the Hi level to the Lo level at time t7. The limiter circuit 152 is not in operation. Accordingly, the first amplifier circuit 140 can output the first optical signal to the second amplifier circuit 145. Operations at and after time t8 are the same as the above-mentioned operations.

The capacitive element 18 holds the second optical signal. Moreover, the capacitive element 19 holds the second reference signal at the potential Vref. Therefore, when the limiter circuit 152 is operated, the capacitive element 19 holds the second reference signal at the potential Vref. Hence, Vsig obtained by subtracting the second reference signal from the second optical signal is:

$$Vsig = Vsat1 - Vref \qquad (2)$$

Hence, even if the second reference signal is subtracted from the second optical signal, the blackening phenomenon does not occur.

Hence, it is possible to prevent the blackening phenomenon from occurring by the first amplifier circuit 140 including the limiter circuit 152.

It was found that the following problem arises if the first amplifier circuit 140 is not provided with the limiter circuit and the second amplifier circuit 145 is provided with the limiter circuit.

Assume that the photodiode 110 receives light from a high brightness subject as indicated by the solid line in FIG. 4 when the first amplifier circuit 140 is not provided with the limiter circuit. In this case, the output of the first amplifier circuit 140 is not limited. Hence, the first reference signal reaches the potential Vsat0 that is at the saturation level of the first amplifier circuit 140. However, the output of the second amplifier circuit 145 is limited by the limiter circuit provided to the second amplifier circuit 145. Hence, the signal level of the second reference signal does not reach the potential Vsat1, and is limited to an output level by the limiter circuit. The limit of the output is set to a potential V5 (not illustrated) that is larger in amplitude than the potential Vref. The potential V5 is expressed as:

$$V5 = Vref + X \qquad (3)$$

The optical signal is then output to the first amplifier circuit 140. The signal level of the first reference signal has already reached the saturation level. Accordingly, the signal level of the first optical signal is the potential Vsat0 that is at the saturation level. On the other hand, the limiter circuit of the second amplifier circuit 145 has canceled the limit of the output of the second amplifier circuit 145. Hence, the signal level of the second optical signal reaches the potential Vsat1 that is at the saturation level of the second amplifier circuit 145. Therefore, Vsig being a difference between the second optical signal and the second reference signal is:

$$Vsig = Vsat1 - V5 \qquad (4)$$

When equation (3) is introduced into equation (4), it is expressed as:

$$Vsig = Vsat1 - Vref - X \qquad (5)$$

As described above, the imaging apparatus of the embodiment includes the limiter circuit 152 that limits the amplitude of each of the first optical signal and the first reference signal. Accordingly, the blackening phenomenon can be suitably prevented.

In the imaging apparatus of the embodiment, the capacitive element 13-1 clamps the output of the first amplifier circuit 140 (the output of the limiter circuit 152) after the first reference signal reaches the second potential V4 limited by the limiter circuit 152. If the capacitive element 13-1 performs clamping before the first reference signal reaches the second potential V4, the amplitude of the second reference signal increases from the potential Vref. Therefore, the range that can be taken by Vsig obtained by subtracting the second reference signal from the second optical signal is reduced by the amount of change in the amplitude of the second reference signal from the potential Vref. On the other hand, in the embodiment, the capacitive element 13-1 performs clamping after reaching the second potential V4 limited by the limiter circuit 152. Accordingly, the second reference signal can remain at the potential Vref. Consequently, it is possible to prevent the reduction in the range that can be taken by Vsig obtained by subtracting the second reference signal from the second optical signal. In other words, the dynamic range of an image generated with Vsig can be prevented from reducing.

In the embodiment, one column circuit portion is provided to one column of the pixels 102. As another example, one column circuit portion may be provided to a plurality of columns of the pixels 102. Moreover, a plurality of column circuit portions may be provided to one column of the pixels 102. Such arrangements fall under the category of an example where each of a plurality of column circuit portions is provided to a column in which pixels are placed.

The first amplifier circuit 140 includes the limiter circuit 152. However, the arrangement is not limited to this example. In other words, the imaging apparatus is simply required to include the limiter circuit 152 that limits the output of the first amplifier circuit 140. For example, it may be a mode in which a plurality of column circuits shares one limiter circuit 152.

Moreover, the embodiment illustrates the example where the sample-and-hold circuit 105 holds the second optical signal being an analog signal and the second reference signal being an analog signal. However, the embodiment is not limited to this example. An AD conversion circuit that converts the output of the second amplifier circuit 145 into a digital signal may be further included. The AD conversion circuit converts the second optical signal and the second reference signal into digital signals respectively. The sample-and-hold circuit 105 may be configured to hold the second optical signal and the second reference signal that have been converted into digital signals.

The embodiment describes the example where the outputs of both the first amplifier circuit 140 and the second amplifier circuit 145 reach saturation when the limiter circuit 152 is not in operation. The embodiment is not limited to this example. Depending on the amplification factor set for each of the first amplifier circuit 140 and the second amplifier circuit 145, an example is also practicable in which the first reference signal of the first amplifier circuit 140 has not reached the saturation level, but the second reference signal of the second amplifier circuit 145 reaches saturation. Also in such a case, the first reference signal and first optical signal of the first amplifier circuit 140 are limited by the limiter circuit 152. Accordingly, the blackening phenomenon can be prevented from occurring. Moreover, the limiter circuit 152 limits the signal level of the first reference signal of the first amplifier circuit 140 even if the second amplifier circuit 145 does not reach the saturation level. Accordingly, the effect of the embodiment is achieved.

Figure 5:
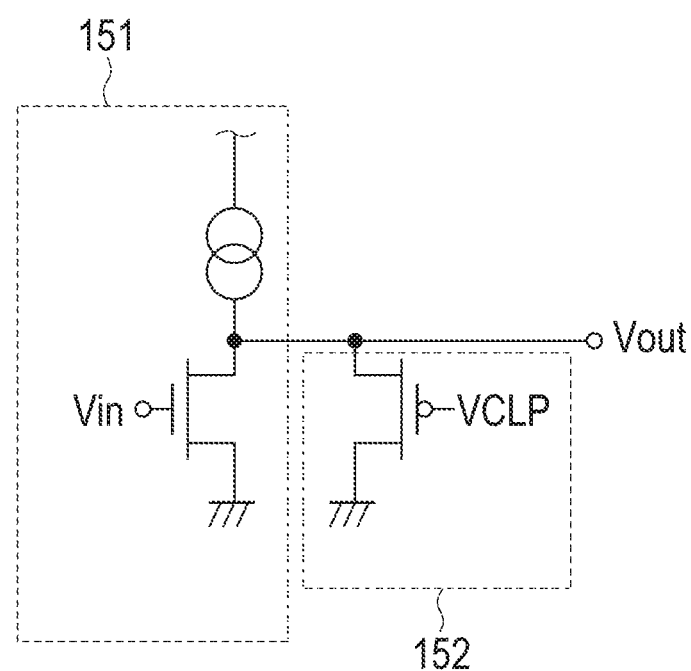
FIG. 5 is a diagram illustrating an example of the configuration of the amplifier and the limiter circuit of the first amplifier circuit.

The embodiment illustrates the example where the first amplifier of the first amplifier circuit 140 is a differential amplifier. The embodiment is not limited to this example. For example, as illustrated in FIG. 5, the first amplifier may be a common-source amplifier circuit.

The embodiment describes the example where the first amplifier circuit 140 includes the limiter circuit 152. Furthermore, the second amplifier circuit 145 may be provided with a second limiter circuit as the limiter circuit. This case can also deal with the following mode. At a time when the reset of the second amplifier circuit 145 is canceled, the potential of the first reference signal is assumed to be a potential Vx that is smaller in amplitude than the potential limited by the limiter circuit 152. The first reference signal reaches the potential V4 limited by the limiter circuit 152 during a period of time between after the reset of the second amplifier circuit 145 is canceled and before time t5 when the signal level of the signal PCT2N changes from the Hi level to the Lo level. The change in potential from the potential Vx to the potential V4 may cause the second reference signal to reach the potential Vsat1 that is at the saturation level, depending on the amplification factor of the second amplifier circuit 145. In such a case, the second reference signal can be limited to a potential having a smaller amplitude than the potential Vsat1 by the second amplifier circuit 145 including the second limiter circuit. Consequently, the occurrence of the blackening phenomenon can be further prevented.

The capacitance value of the capacitive element 13-1 and the capacitance value of the capacitive element 14-2 may be made the same to set the amplification factor of the second amplifier circuit 145 to one.

Second Embodiment

An imaging apparatus of the embodiment is described focusing on points different from those of the first embodiment.

In terms of the column amplification portion 104 of the imaging apparatus of the first embodiment, the first amplifier circuit 140 is an inverting amplifier circuit, and the second amplifier circuit 145 is a non-inverting amplifier circuit. In terms of the column amplification portions of the imaging apparatus of the embodiment, both of the first and second amplifier circuits are inverting amplifier circuits.

The configuration of the imaging apparatus of the embodiment is the same as the configuration illustrated in FIG. 1.

Figure 6:
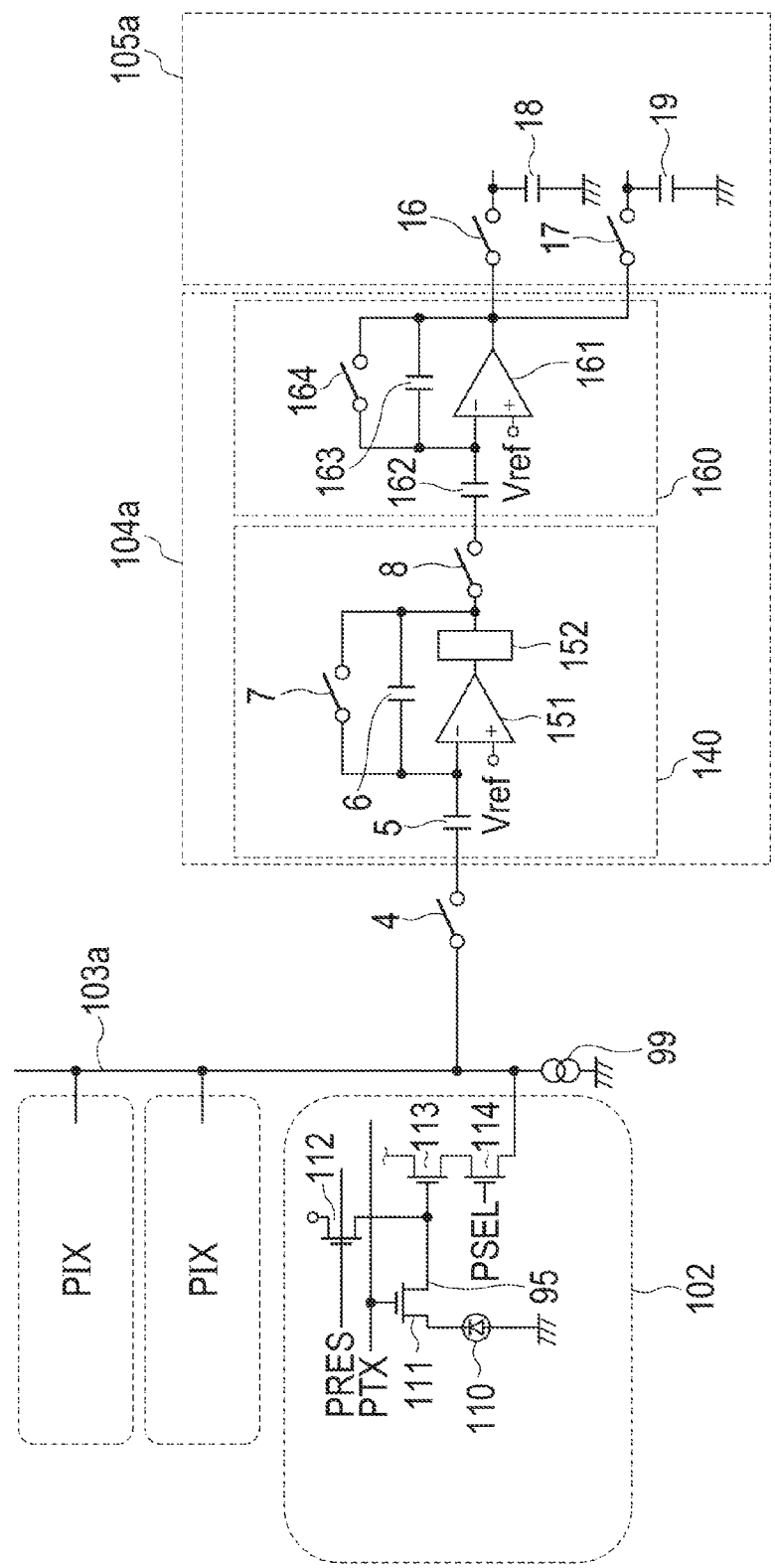
FIG. 6 is a diagram illustrating an example of the configuration of the imaging apparatus.

FIG. 6 is a diagram illustrating the pixel 102, the column amplification portion 104a, and the sample-and-hold circuit 105a of the embodiment. The reference numerals assigned in FIG. 2 are also assigned in FIG. 6 to members of FIG. 6 having the same functions as those illustrated in FIG. 2. The column amplification portion 104a of the embodiment includes the first amplifier circuit 140 and a second amplifier circuit 160. Both of the first amplifier circuit 140 and the second amplifier circuit 160 are inverting amplifier circuits.

The second amplifier circuit 160 includes an amplifier 161, a capacitive element 162, a capacitive element 163, and a switch 164. When the switch 164 is turned off, the second amplifier circuit 160 outputs, to the sample-and-hold circuit 105a, a signal that has been amplified from the signal output from the first amplifier circuit 140 at an amplification factor expressed in the capacitance value of the capacitive element 162/the capacitance value of the capacitive element 163.

Figure 7:
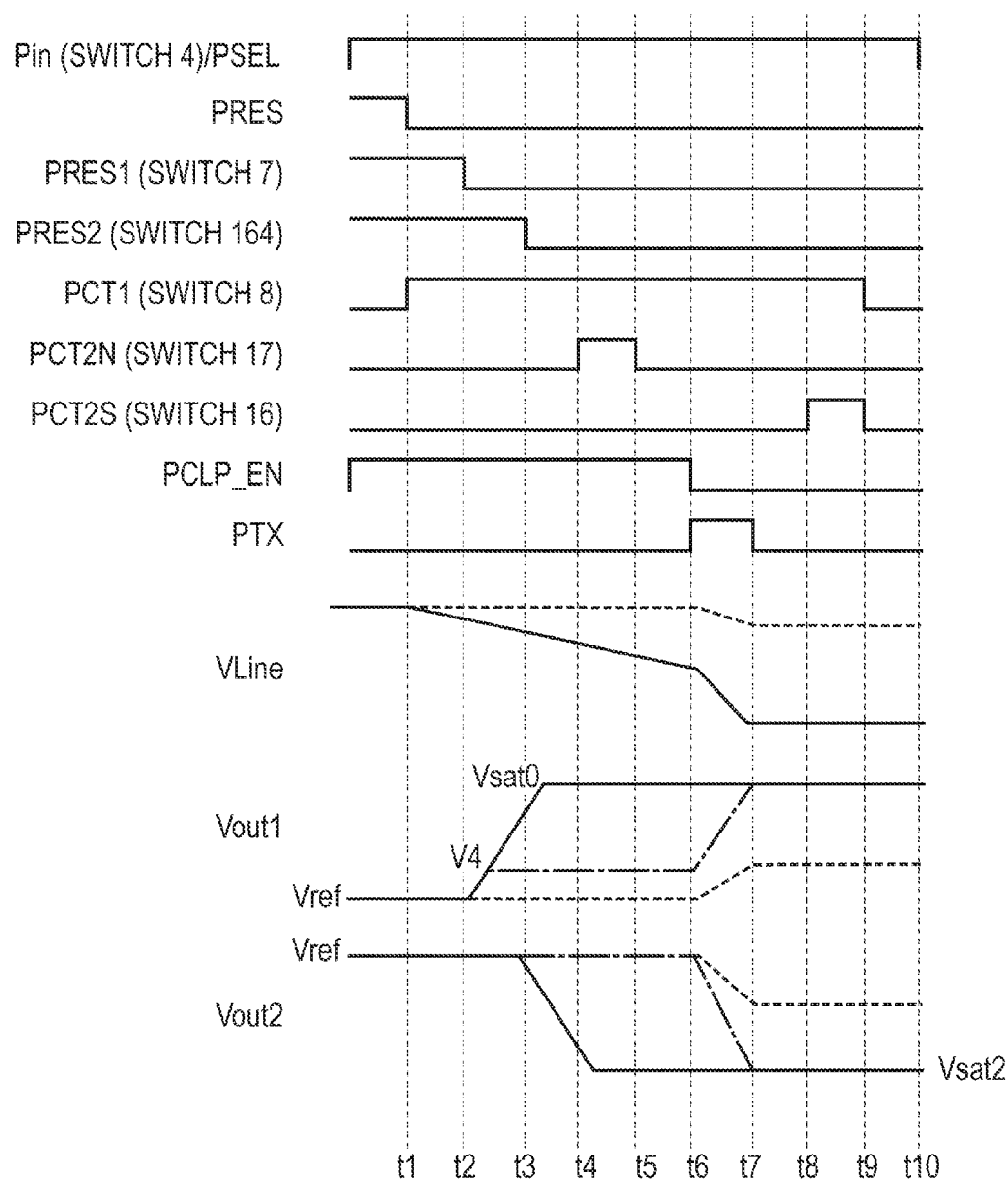
FIG. 7 is a diagram illustrating an example of the operation of the imaging apparatus.

FIG. 7 is a timing chart illustrating the operation of the imaging apparatus illustrated in FIG. 6.

The signal PRES2 illustrated in FIG. 7 is a signal that is output from an unillustrated control circuit to the switch 164. Moreover, Vout2 illustrated in FIG. 7 indicates the output of the second amplifier circuit 160.

In the potential VLine illustrated in FIG. 7, a solid line represents a potential of a case where the photodiode 110 receives light from a high brightness subject. On the other hand, a broken line represents a potential of a case where the photodiode 110 receives light from a low to intermediate brightness subject.

In the outputs Vout1 and Vout2, broken lines represent a potential of a case where the photodiode 110 receives light from a low to intermediate brightness subject. Moreover, in the outputs Vout1 and Vout2, dot-and-dash lines represent a potential of a case where the photodiode 110 receives light from a high brightness subject when the limiter circuit 152 operates. Moreover, in the outputs Vout1 and Vout2, solid lines represent a potential of a case where the photodiode 110 receives light from a high brightness subject when the limiter circuit 152 does not operate.

The operations illustrated in FIG. 7 are the same as the operations illustrated in FIG. 4. The saturation level of the output of the second amplifier circuit 160 is a potential Vsat2.

As in the first embodiment, also in the imaging apparatus of the embodiment, the first amplifier circuit 140 includes the limiter circuit 152. Consequently, if the photodiode 110 receives light from a high brightness subject, it is possible to obtain Vsig=Vref−Vsat2. Consequently, also in the imaging apparatus of the embodiment, it is possible to prevent the occurrence of the blackening phenomenon upon photographing the high brightness subject.

Moreover, as in the operation illustrated at time t3 of FIG. 7, also in the imaging apparatus of the embodiment, the capacitive element 162 clamps the potential V4 of the first reference signal limited by the limiter circuit 152. Consequently, the imaging apparatus of the embodiment also has the same effect as the imaging apparatus of the first embodiment.

Third Embodiment

An imaging apparatus of the embodiment is described focusing on points different from those of the first embodiment.

The imaging apparatus of the embodiment is different from the imaging apparatus of the first embodiment in the respect that both of the first and second amplifier circuits are fully differential amplifier circuits.

The configuration of the imaging apparatus of the embodiment is the same as the configuration illustrated in FIG. 1.

Figure 8:
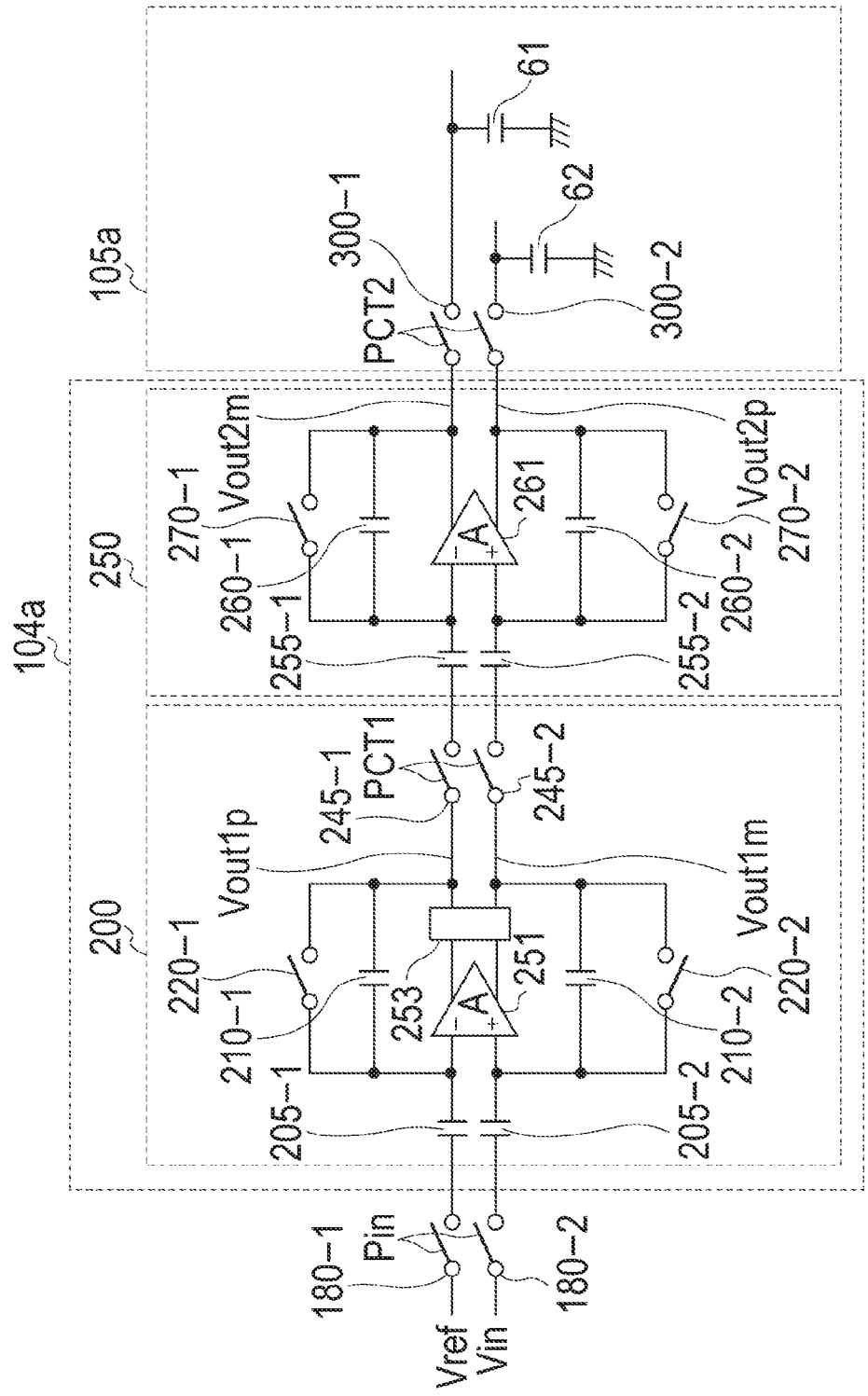
FIG. 8 is a diagram illustrating an example of the configuration of the imaging apparatus.

FIG. 8 is a diagram illustrating the configuration of the column amplification portion 104a and the sample-and-hold circuit 105a of the embodiment. The column amplification portion 104a includes a first amplifier circuit 200 and a second amplifier circuit 250. The first amplifier circuit 200 and the second amplifier circuit 250 are fully differential amplifier circuits respectively.

The first amplifier circuit 200 includes a capacitive element 205-1, a capacitive element 205-2, a capacitive element 210-1, a capacitive element 210-2, a switch 220-1, a switch 220-2, a switch 245-1, and a switch 245-2. Furthermore, the first amplifier circuit 200 includes an amplifier 251 and a limiter circuit 253. A signal output by the pixel 102 to the vertical signal line 103a is input into Vin illustrated in FIG. 8.

The second amplifier circuit 250 includes a capacitive element 255-1, a capacitive element 255-2, a capacitive element 260-1, a capacitive element 260-2, a switch 270-1, and a switch 270-2. Furthermore, the second amplifier circuit 250 includes an amplifier 261.

The sample-and-hold circuit 105a includes a switch 300-1, a switch 300-2, a capacitive element 61, and a capacitive element 62.

The switches 180-1 and 180-2 are controlled by a common signal Pin.

The switches 220-1 and 220-3 are controlled by the common signal PRES1.

The switches 245-1 and 245-2 are controlled by the common signal PCT1. The switches 270-1 and 270-2 are controlled by the common signal PRES2.

The switches 300-1 and 300-2 are controlled by the common signal PCT2.

Figure 9:
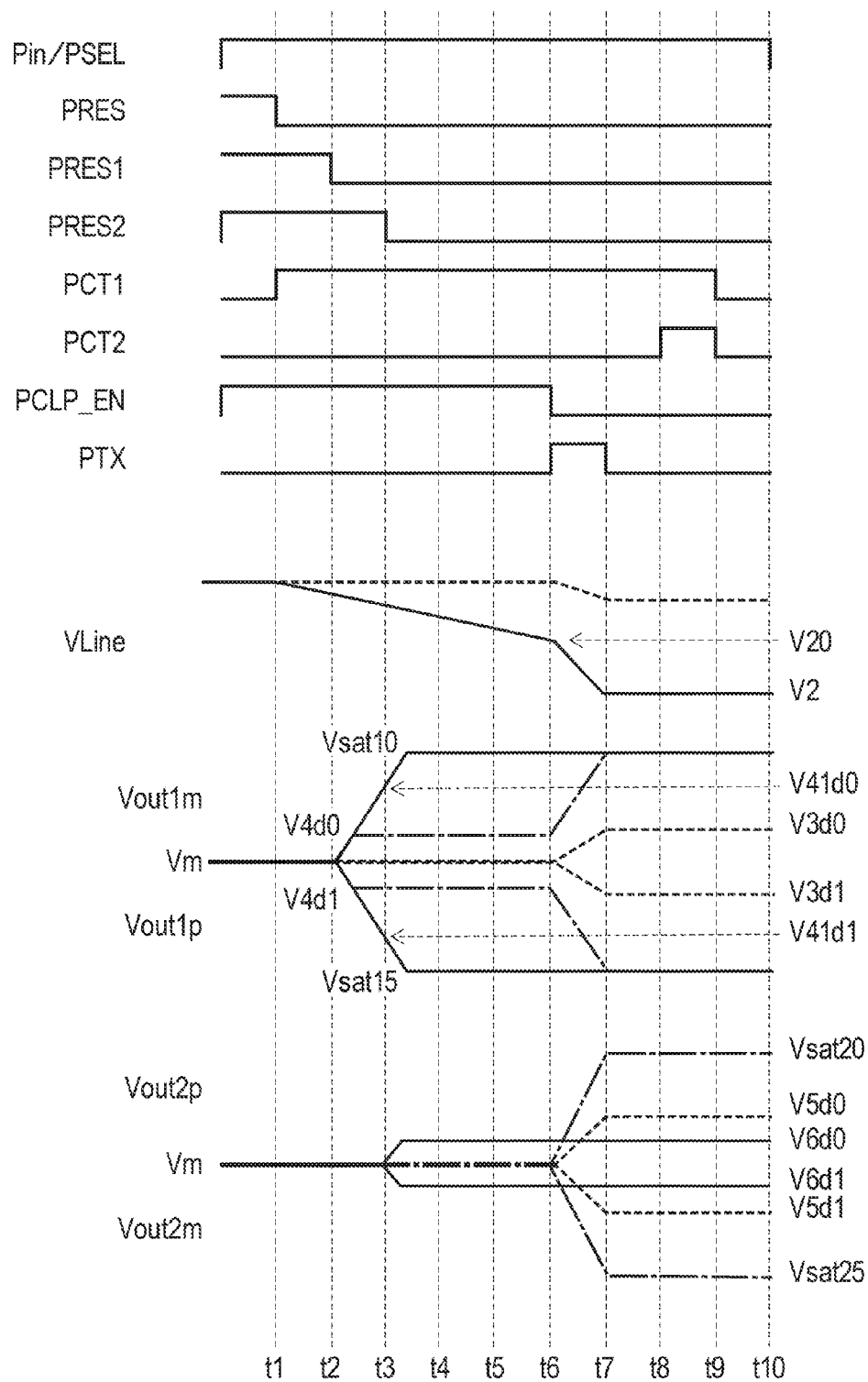
FIG. 9 is a diagram illustrating an example of the operation of the imaging apparatus.

FIG. 9 is a timing chart illustrating the operation of the imaging apparatus illustrated in FIG. 8.

Potentials Vout1m, Vout1p, Vout2p, and Vout2m illustrated in FIG. 9 are potentials of nodes illustrated in FIG. 8 respectively.

In the potential VLine illustrated in FIG. 9, a solid line represents a potential of a case where the photodiode 110 receives light from a high brightness subject. On the other hand, a broken line represents a potential of a case where the photodiode 110 receives light from a low to intermediate brightness subject.

In the potentials Vout1m, Vout1p, Vout2p, and Vout2m, broken lines represent a potential of a case where the photodiode 110 receives light from a low to intermediate brightness subject. Moreover, in the potentials Vout1m, Vout1p, Vout2p, and Vout2m, dot-and-dash lines represent a potential of a case where the photodiode 110 receives light from a high brightness subject when the limiter circuit 152 operates. Moreover, in the potentials Vout1m, Vout1p, Vout2p, and Vout2m, solid lines represent a potential of a case where the photodiode 110 receives light from a high brightness subject when the limiter circuit 253 does not operate.

At time t2, an unillustrated control circuit changes the signal level of the signal PRES1 from the Hi level to the Lo level. Consequently, the reset of the first amplifier circuit 200 is canceled.

A case where light of a high brightness subject is incident on the photodiode 110 is described.

In this case, the potential Vout1m increases and the potential Vout1p decreases with the decreasing potential of the potential VLine. Then, the potential Vout1m reaches a potential Vsat10 that is at the saturation level and the potential Vout1p reaches a potential Vsat15 that is at the saturation level.

At time t3, the unillustrated control circuit changes the signal level of the signal PRES2 from the Hi level to the Lo level. Consequently, the reset of the second amplifier circuit 250 is canceled.

The second amplifier circuit 250 outputs signals amplified from a potential equal to the amount of change with reference to a potential V41d0 that is the potential Vout1m at time t3 and a potential V41d1 that is the potential Vout1p at time t3.

When the potential Vout1m reaches the potential Vsat10 that is at the saturation level, and the potential Vout1p reaches the potential Vsat15 that is at the saturation level, the potential changes in the potentials Vout2p and Vout2m end. The potential Vout2p becomes a potential V6d0, and the potential Vout2m becomes a potential V6d1.

After changing the signal level of the signal PTX from the Lo level to the Hi level, then an unillustrated vertical scan circuit changes it from the Hi level to the Lo level. However, since the potentials Vout1m and Vout1p being the outputs of the first amplifier circuit 200 have already reached the saturation level, even if the potential VLine decreases, the potentials Vout1m and Vout1p do not change from the saturation levels.

After changing the signal level of the signal PCT2 from the Lo level to the Hi level at time t8, then the unillustrated control circuit changes it from the Hi level to the Lo level at time t9. Consequently, the capacitive element 61 holds the potential V6d1 of the potential Vout2m. Moreover, the capacitive element 62 holds the potential V6d0 of the potential Vout2p.

Therefore, the potential Vout2p being the output of the second amplifier circuit 250 remains at the potential V6d0, and the potential Vout2m also remains at the potential V6d1. The potential V6d0 of the potential Vout2p is smaller in amplitude than a potential Vsat20 that is at the saturation level of the potential Vout2p. Moreover, the potential V6d1 of the potential Vout2m is smaller in amplitude than a potential Vsat25 that is at the saturation level of the potential Vout2m. Therefore, the blackening phenomenon occurs in which a portion that should be originally shown as white as an image appears black and sunk.

The blackening phenomenon that occurs in the imaging apparatuses of the first and second embodiments occurs due to the CDS process that obtains the difference between the second optical signal and the second reference signal.

On the other hand, the blackening phenomenon that occurs in the imaging apparatus of the embodiment occurs because the output of the first amplifier circuit 200 saturates before the pixel 102 outputs the optical signal, and it enters a state where the output of the second amplifier circuit 250 does not saturate. This state occurs due to the setting condition of the amplification factor of each of the first amplifier circuit 200 and the second amplifier circuit. Alternatively, this state occurs due to the existence of a time difference between the change in the signal level of the signal PRES1 from the Hi level to the Lo level and the change in the signal level of the signal PRES2 from the Hi level to the Lo level.

The imaging apparatus of the embodiment includes the limiter circuit 253 in the first amplifier circuit 200. A case where the limiter circuit 253 limits the output of the first amplifier circuit 200 is described.

The unillustrated control circuit sets the signal level of the signal PCLP_EN to the Hi level over a period of time from time t1 to time t6. Consequently, the limiter circuit 253 is in the operable state.

After the potentials Vout1*m* and Vout1*p* change, the limiter circuit 253 limits the potential Vout1*m* to a potential V4*d*0, and the potential Vout1*p* to a potential V4*d*1 from time t2.

The unillustrated control circuit then changes the signal level of the signal PRES2 from the Hi level to the Lo level.

The potentials Vout2*p* and Vout2*m* remain at a potential Vm until time t6 when the unillustrated vertical scan circuit changes the signal level of the signal PTX from the Lo level to the Hi level.

At time t6, the unillustrated control circuit changes the signal PCLP_EN to the Lo level. Consequently, the limiter circuit 253 is put in non-operation. Hence, the potential Vout1*m* reaches the potential Vsat10 that is at the saturation level, and the potential Vout1*p* reaches the potential Vsat15 that is at the saturation level. In accordance with the potentials Vout1*m* and Vout1*p*, the potential Vout2*p* reaches the potential Vsat20 that is at the saturation level, and the potential Vout2*m* reaches the potential Vsat25 that is at the saturation level. At time t9, the capacitive elements 61 and 62 hold their potentials respectively.

In this manner, the imaging apparatus of the embodiment includes a plurality of fully differential amplifier circuits in one column amplification portion 104. Also in this configuration, the first amplifier circuit 200 includes the limiter circuit 253 to have the effect of being able to prevent the occurrence of the blackening phenomenon.

Moreover, as in the operation illustrated at time t3 of FIG. 9, also in the imaging apparatus of the embodiment, both of the capacitive elements 255-1 and 255-2 clamp the first reference signal limited by the limiter circuit 253. Consequently, the imaging apparatus of the embodiment can also obtain the same effect as that of the imaging apparatus of the first embodiment.

It may be configured such that all of the capacitive elements 255-1, 255-2, 260-1, and 260-2 have the same capacitance value and the amplification factor of the second amplifier circuit 250 is set to one.

Fourth Embodiment

An imaging apparatus of the embodiment is described focusing on points different from those of the first embodiment.

The configuration of the imaging apparatus of the embodiment is the same as the configuration illustrated in FIG. 1. Moreover, the configuration of the column amplification portion 104 and the sample-and-hold circuit 105 is the same as the configuration illustrated in FIG. 2.

The imaging apparatus of the embodiment is different from the imaging apparatus of the first embodiment in the respect that the limiter circuit 152 is also set to the operable state also during a period of time when the pixel 102 outputs the optical signal.

Figure 10:
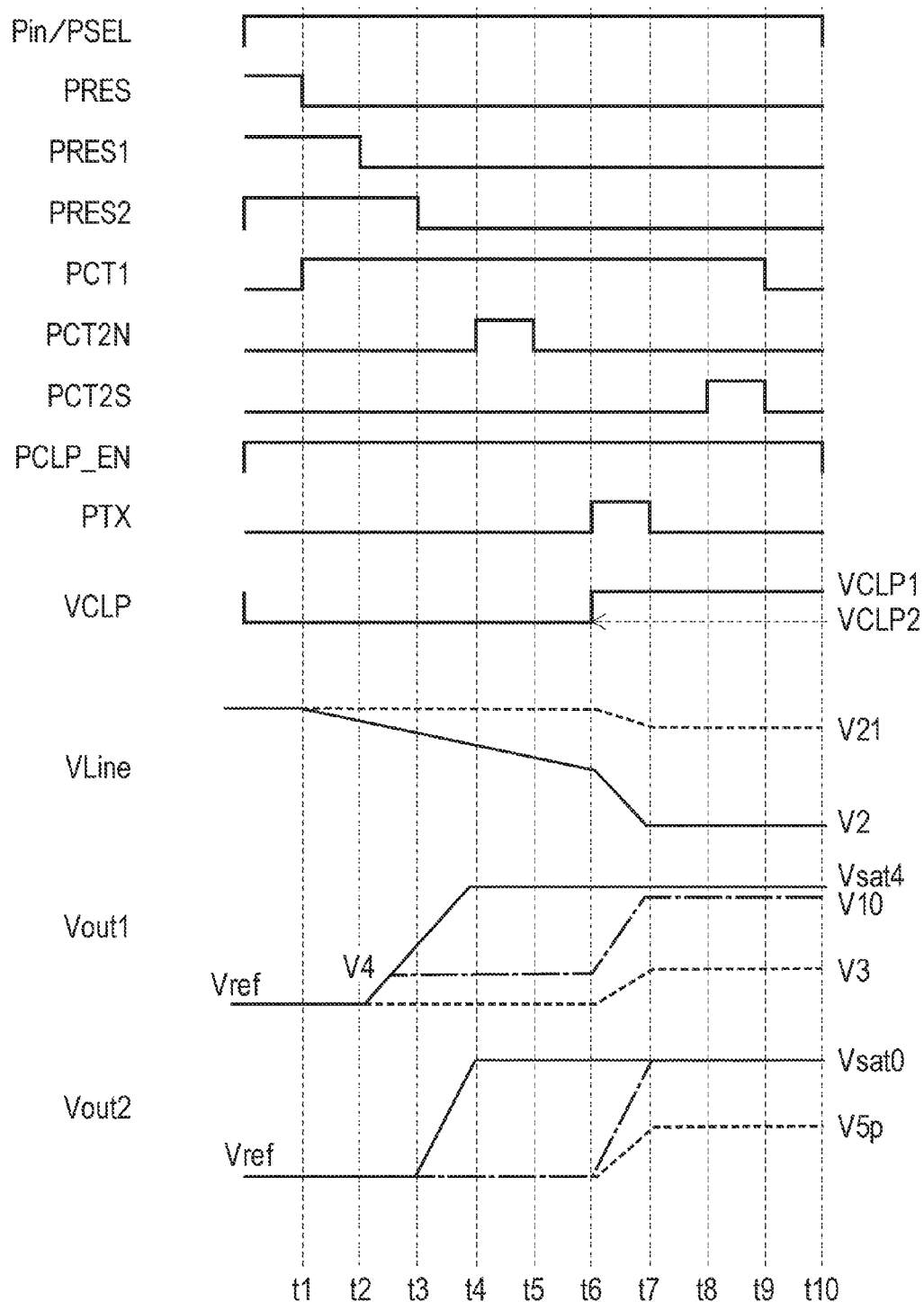
FIG. 10 is a diagram illustrating an example of the operation of the imaging apparatus.

FIG. 10 is a timing chart illustrating the operation of the imaging apparatus of the embodiment. What are different from the first embodiment is that the signal level of the signal PCLP_EN is the Hi level over time t1 to time t10, and that an unillustrated control circuit further outputs a signal VCLP to the limiter circuit 152. The signal VCLP is a signal that controls the potential for allowing the limiter circuit 152 to limit the output of the first amplifier circuit 140.

The signal level of the signal VCLP is the Lo level (VCLP2) during a period of time from time t1 to time t6. Moreover, the signal level of the signal VCLP is the Hi level (VCLP1) during a period of time from time t6 to time t10.

The operations from time t1 to time t6 are the same as those in the first embodiment.

At time t6, the unillustrated control circuit changes the signal level of the signal VCLP from the Lo level to the Hi level. Consequently, the limit of the output of the first amplifier circuit 140 changes from the potential V4 to a potential V10.

Consequently, the amplitude of the first optical signal at and after time t7 is limited up to the potential V10. The first optical signal is limited up to the potential V10 to make it hard for the second optical signal being the output of the second amplifier circuit 145 to become saturated. Moreover, the first optical signal of the first amplifier circuit 140 is not saturated. If the current source 101 is included inside the first amplifier of the first amplifier circuit 140, a change in the current of the current source 101 resulting from the saturation of the output of the first amplifier circuit 140 can be prevented by the limiter circuit 152 limiting the range of the amplitude of the first optical signal. Consequently, a change in the potential of a power supply line (for example, a ground line) connected to the current source is prevented. The power supply line is connected in common to the first amplifier circuits 140 of the plurality of column circuits. A change in the potential of the power supply line also propagates to the column circuits of other columns. Hence, the saturation of the output of the first optical signal of the first amplifier circuit 140 changes the first optical signals of the other column circuits. The change spreads to adjacent column circuits centering the column circuit where the output of the first optical signal has been saturated. Hence, the change of the first optical signal appears, in an image, as a smear (horizontal smear) extending like a horizontal streak from a point where the first optical signal has been saturated. In the embodiment, the limiter circuit 152 prevents the saturation of the first amplifier circuit 140. Accordingly, the occurrence of the horizontal smear can be reduced.

The limiter circuit 152 imposes an output limit also on the first reference signal. Accordingly, it becomes hard for the saturation of the second optical signal output by the second amplifier circuit 145 to occur. Also in the second amplifier circuit 145, if a current source is included inside the second amplifier 153, it is possible to prevent a change in the current of the current source resulting from the saturation of the output of the second amplifier circuit 145. Consequently, a change in the potential of a power supply line (for example, a ground line) connected to the current source is prevented. The power supply line is connected in common to the second amplifier circuits 145 of a plurality of column circuits. The change in the potential of the power supply line also propagates to the column circuits of other columns. Hence, the saturation of the output of the second optical signal of the second amplifier circuit 145 changes the second optical signals of the other column circuits. The change spreads to adjacent column circuits centering the column circuit where the output of the second optical signal has been saturated. Hence, the change in the second optical signal appears, in an image, as a smear (horizontal smear) extending like a horizontal streak from a point where the second optical signal has been saturated. In the embodiment, the limiter circuit 152 makes it hard for saturation to occur in the second amplifier circuit 145. Accordingly, the occurrence of the horizontal smear can be reduced.

The limit of the amplitude of the first optical signal by the limiter circuit 152 can also be applied in the imaging apparatuses of the second and third embodiments.

Fifth Embodiment

When the signal output by the fully differential amplifier circuit reaches the saturation level, the consumption current of the fully differential amplifier circuit changes from a state before the reaching of the saturation level. A plurality of fully differential amplifier circuits may be provided respectively to a plurality of columns of pixels. In this case, the plurality of fully differential amplifier circuits may be connected to a common power supply line. A change in the consumption current of the fully differential amplifier circuit whose output has reached the saturation level causes a change in the potential of the power supply line connected in common to the plurality of fully differential amplifier circuits. The change in potential causes a change in the output of a fully differential amplifier circuit different from the fully differential amplifier circuit that has reached the saturation level. Consequently, the smear phenomenon occurs in which a stripe like a horizontal streak appears in an image generated using a signal output by the imaging apparatus.

As described in the smear phenomenon and the blackening phenomenon, there is a problem in the improvement of the accuracy of a signal that is output by the fully differential amplifier circuit.

An embodiment described below provides a technology for contributing to the improvement of the accuracy of a signal that is output by the fully differential amplifier circuit when the fully differential amplifier circuit amplifies the noise signal and the optical signal that are output by a pixel.

An imaging apparatus of the embodiment is described with reference to the drawings.

Figure 11:
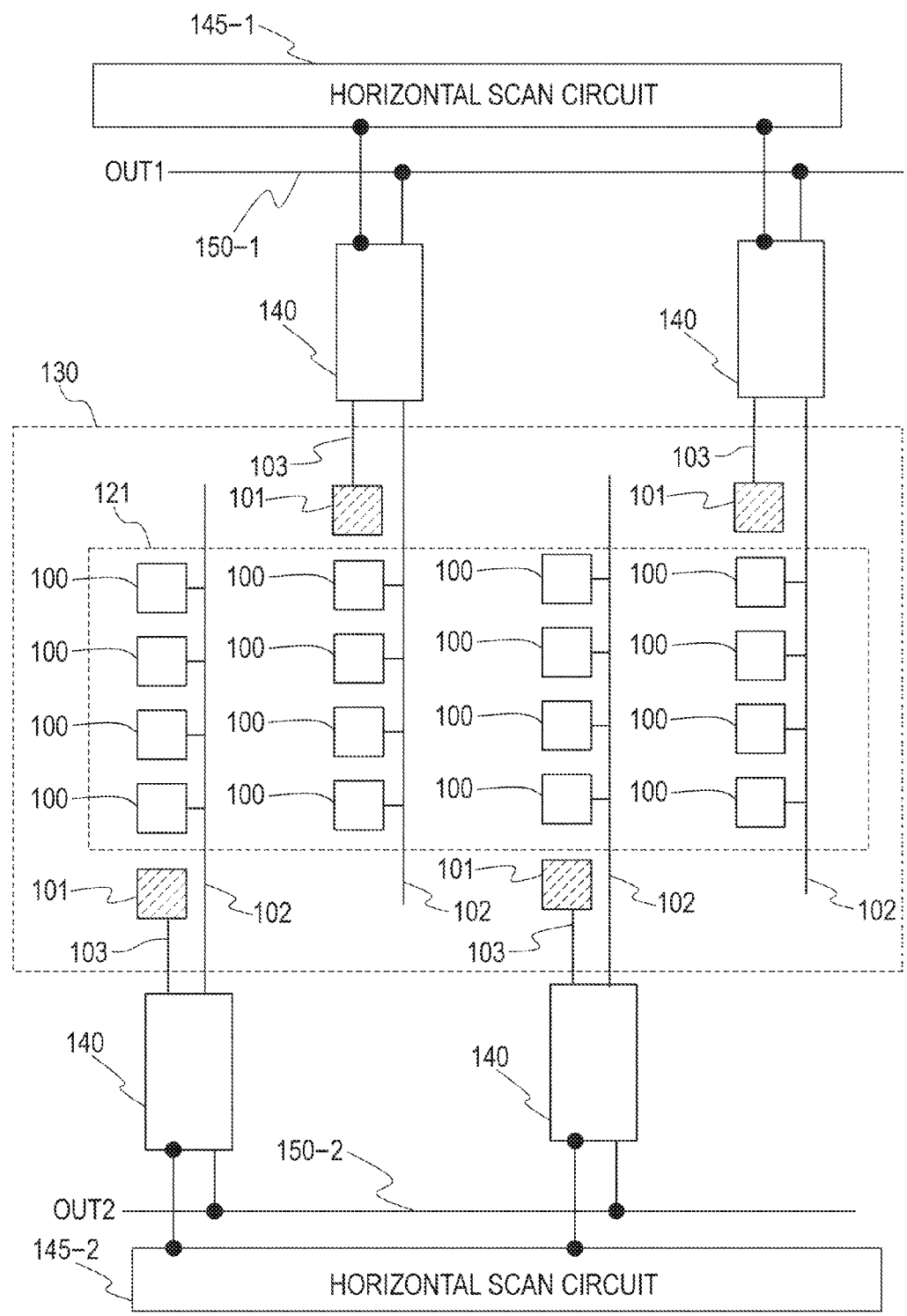
FIG. 11 is a diagram illustrating an example of the configuration of the imaging apparatus.

FIG. 11 is a diagram illustrating an example of the configuration of the imaging apparatus of the embodiment.

The imaging apparatus of the embodiment includes a pixel array 130 and column circuits 140. The pixel array 130 includes an effective pixel area 121 where effective pixels 100 are placed over a plurality of rows and a plurality of columns, and reference pixels 101 placed over the plurality of columns. A plurality of effective pixels 100 and one reference pixel 101 are placed in one pixel column. The effective pixel 100 is connected to the column circuit 140 via a first signal line 102. Moreover, the reference pixel 101 is connected to the column circuit 140 via a second signal line 103. Each of the plurality of column circuits 140 is provided to one column provided with the effective pixels 100.

Furthermore, the imaging apparatus includes a horizontal scan circuit 145-1 and a horizontal scan circuit 145-2. The horizontal scan circuit 145-1 performs horizontal scanning where the column circuits 140 in even-numbered columns are sequentially selected. Moreover, the horizontal scan circuit 145-2 performs horizontal scanning where the column circuits 140 in odd-numbered columns are sequentially selected. Each of the column circuits 140 in the even-numbered columns selected in horizontal scanning by the horizontal scan circuit 145-1 outputs, to an output line 150-1, a signal based on a signal output by the effective pixel 100 to the first signal line 102, and a signal output by the reference pixel 101 to the second signal line 103. Each of the column circuits 140 in the odd-numbered columns selected in horizontal scanning by the horizontal scan circuit 145-2 outputs, to an output line 150-2, a signal based on a signal output by the effective pixel 100 to the first signal line 102, and a signal output by the reference pixel 101 to the second signal line 103.

Figure 12:
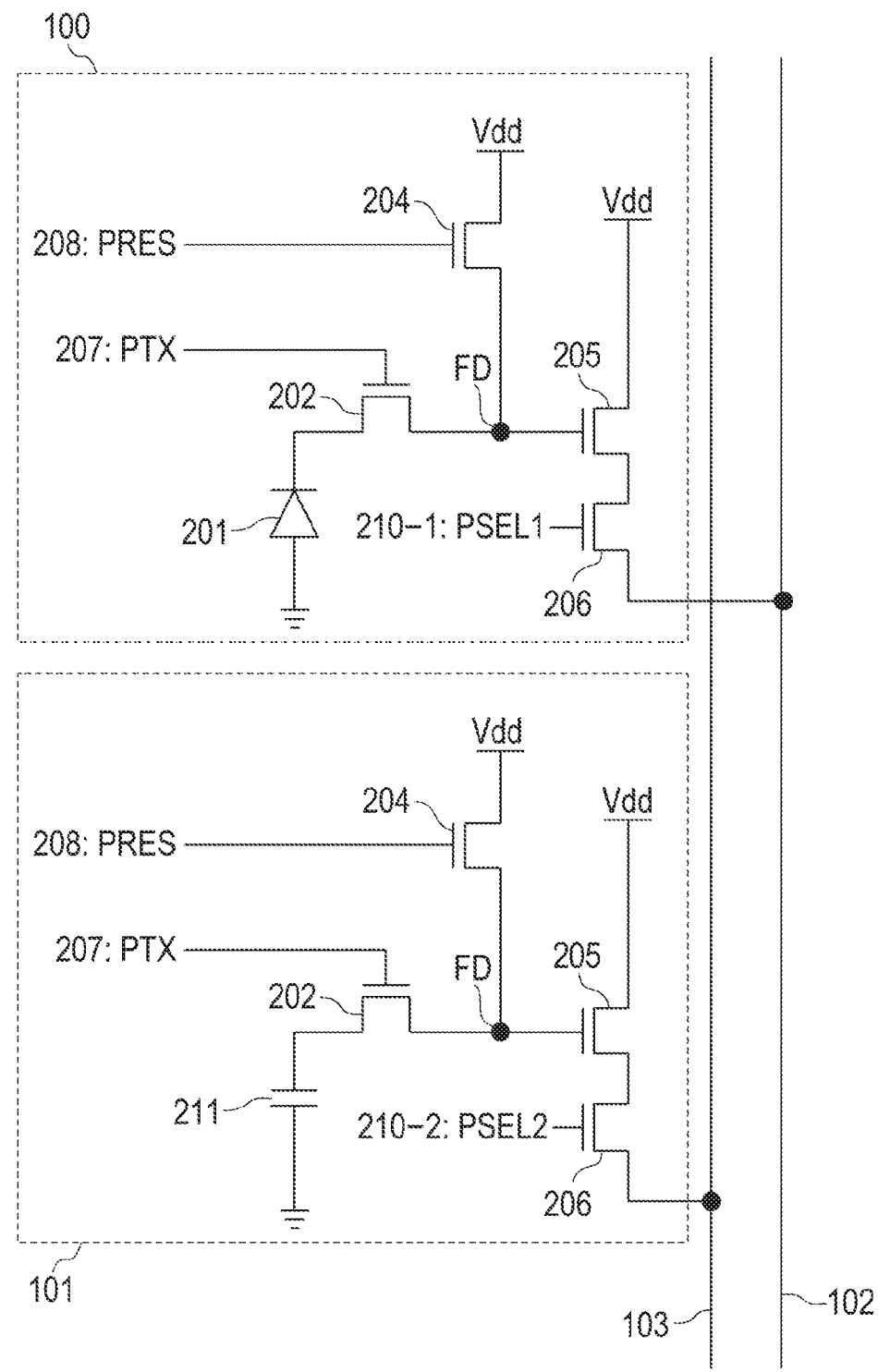
FIG. 12 is a diagram illustrating an example of the configuration of an effective pixel and a reference pixel.

FIG. 12 is a diagram illustrating the details of the effective pixel 100 and the reference pixel 101. The effective pixel 100 includes a photodiode 201 being a photoelectric conversion portion, region, or circuit, a transistor 202, a transistor 204, a transistor 205, and a transistor 206. In the embodiment, electric charge that is accumulated by the photodiode 201 is an electron. One of main nodes of the transistor 202, one of main nodes of the transistor 204, and a gate of the transistor 205 are connected to a node FD being a common node. A voltage Vdd is fed to the other main node of the transistor 204.

The voltage Vdd is fed to one of main nodes of the transistor 205. Moreover, the other main node of the transistor 205 is connected to one of main nodes of the transistor 206. The other main node of the transistor 206 is connected to the first signal line 102. The other main node of the transistor 205 can be said to be connected to the first signal line 102 via the transistor 206.

A gate of the transistor 202 is connected to a control line 207. A gate of the transistor 204 is connected to a control line 208. A gate of the transistor 206 is connected to a control line 210-1. An unillustrated vertical scan circuit outputs signals PTX, PRES, and PSEL1 to the control lines 207, 208, and 210-1, respectively.

The reference pixel 101 has the same configuration as the effective pixel 100 except the respects that the reference pixel 101 includes a capacitive element 211 instead of the photodiode 201, and that the transistor 206 is connected not to the first signal line 102 but to the second signal line 103. The unillustrated vertical scan circuit outputs a signal PSEL2 to the gate of the transistor 206 of the reference pixel 101 via a control line 210-2.

The unillustrated vertical scan circuit performs vertical scanning where the effective pixels 100 are sequentially selected on a row by row basis. Moreover, the unillustrated vertical scan circuit also selects the reference pixel 101 during a period of time while the effective pixels 100 are being selected.

Figure 13:
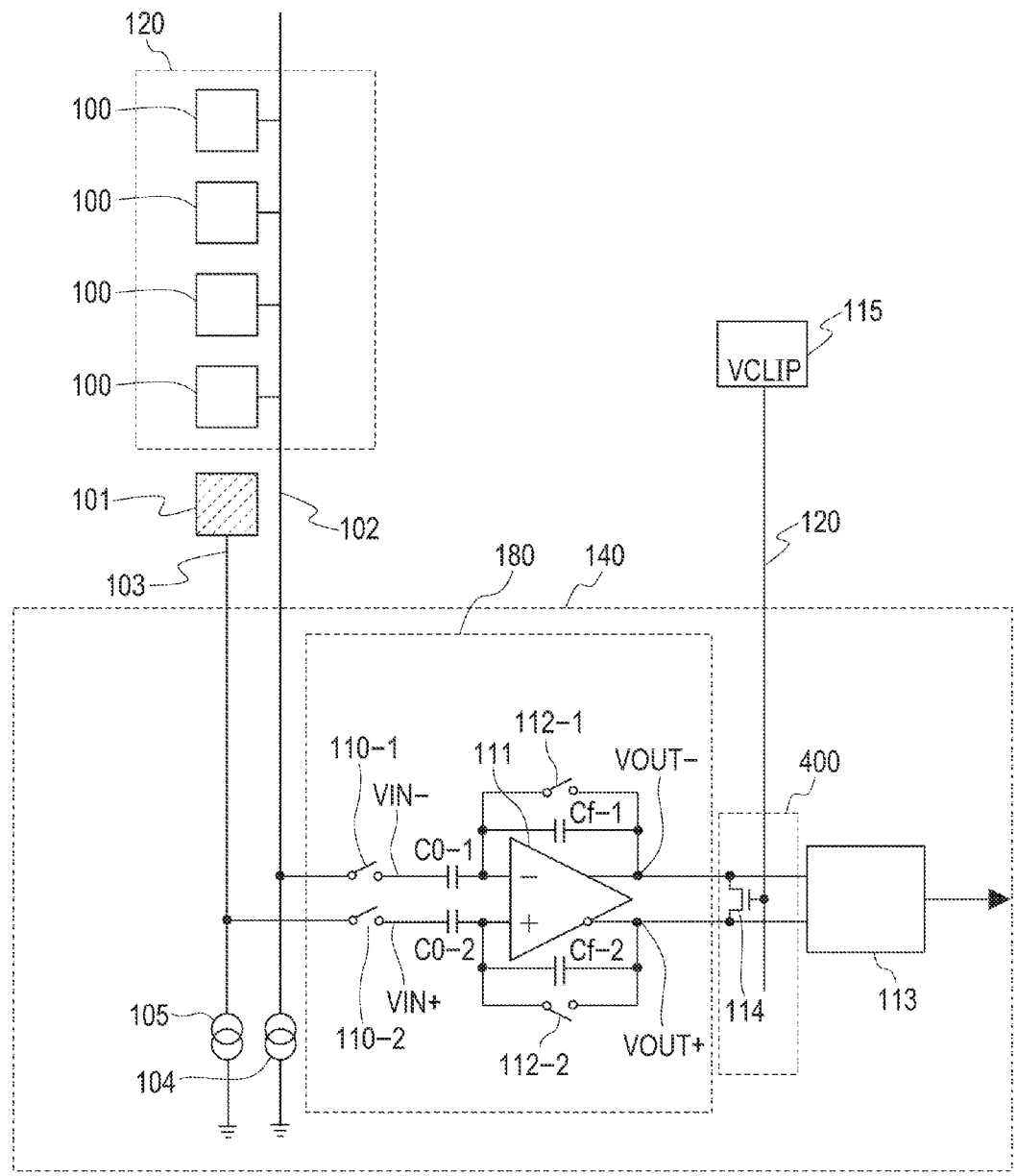
FIG. 13 is a diagram illustrating an example of the configuration of a column circuit.

FIG. 13 is a diagram illustrating one pixel column and one column circuit 140 in the imaging apparatus illustrated in FIG. 11.

The column circuit 140 includes a first current source 104 and a second current source 105. The first current source 104 supplies a current to the transistor 205 of the effective pixel 100 via the first signal line 102 and the transistor 206 of the effective pixel 100. The second current source 105 supplies a current to the transistor 205 of the reference pixel 101 via the second signal line 103 and the transistor 206 of the reference pixel 101. The transistor 205 of the effective pixel 100 and the first current source 104 form a source follower circuit. Moreover, the transistor 205 of the reference pixel 101 and the second current source 105 form a source follower circuit.

The column circuit 140 further includes a signal processing circuit 113, a fully differential amplifier circuit 180, and an output limiting circuit 400. The fully differential amplifier circuit 180 includes a switch 110-1, a switch 110-2, a capacitive element C0-1, a capacitive element C0-2, a switch 112-1, a switch 112-2, a capacitive element Cf-1, a capacitive element Cf-2, and a differential amplifier 111. The output limiting circuit 400 includes a transistor 114. A gate being the control node of the transistor 114 is connected to a control line 120. The control line 120 is fed with a voltage VCLIP output by a clipping voltage control circuit 115. One clipping voltage control circuit 115 outputs the common voltage VCLIP to the column circuits 140 in a plurality of columns via the control line 120. Moreover, the transistor 114 is connected to a node from which an output VOUT+ is output, which is a first output node of the fully differential amplifier circuit 180, and a node from which an output VOUT− is output, which is a second output node of the fully differential amplifier circuit 180. A node of the fully differential amplifier circuit 180 into which an input VIN− is input is an input node (third input node) of the fully differential amplifier circuit 180. A node into which an input VIN+ is input is an input node (fourth input node) of the fully differential amplifier circuit 180.

The horizontal scan circuit 145-1 or 145-2 inputs a selection signal into the signal processing circuit 113. The signal processing circuit 113 of the column circuit 140 into which an active selection signal has been input outputs, to the output line 150-1 or 150-2, a signal obtained by processing a signal output by the fully differential amplifier circuit 180.

Figure 14:
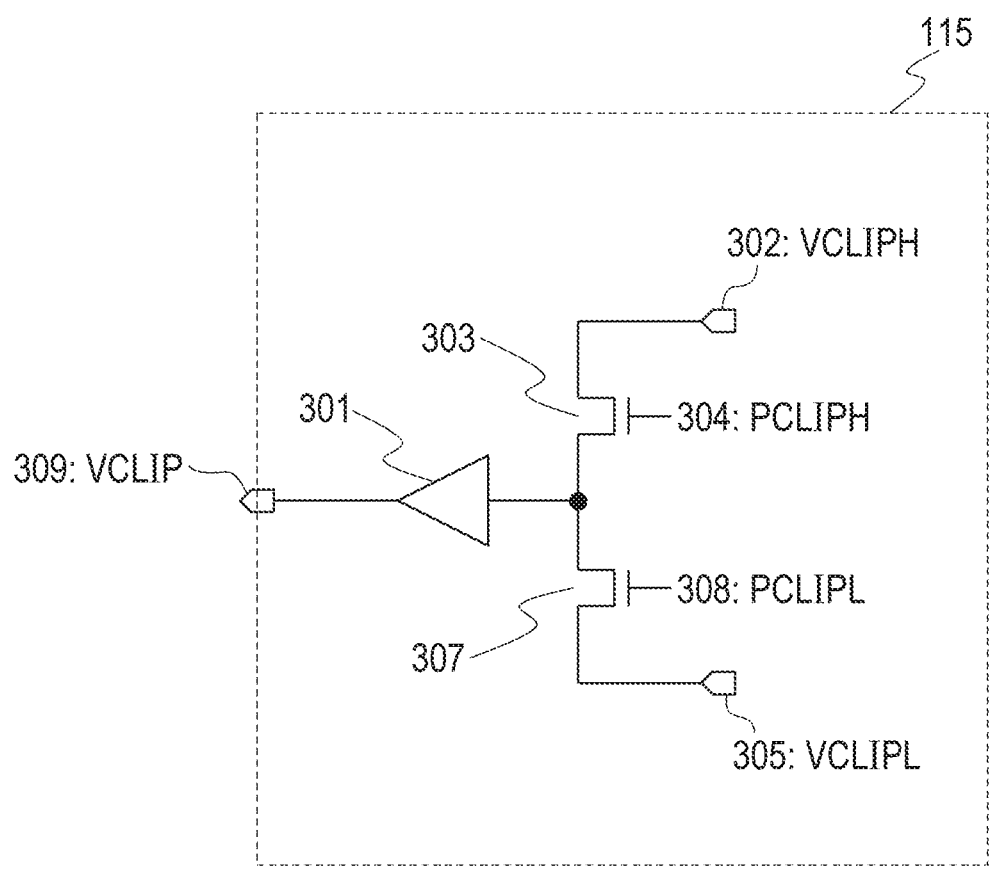
FIG. 14 is a diagram illustrating an example of the configuration of a clipping voltage control circuit.

FIG. 14 is a diagram illustrating the configuration of the clipping voltage control circuit 115. The clipping voltage control circuit 115 includes a buffer circuit 301, a voltage supply portion 302, a transistor 304, a voltage supply portion 305, a transistor 308, and a clipping voltage supply portion 309. The transistors 304 and 308 are switches that are turned on and off according to the signal levels of signals PCLIPH and PCLIPL input respectively into gates of the transistors 304 and 308 from an unillustrated control circuit. The voltage supply portion 302 supplies a voltage VCLIPH. The voltage supply portion 305 supplies a voltage VCLIPL. The amplitude of the voltage VCLIPH is larger than that of the voltage VCLIPL. The voltage VCLIPH is a first voltage that is input into the gate being the control node of the transistor 114 of the output limiting circuit 400. Moreover, the voltage VCLIPL is a second voltage that is input into the gate being the control node of the transistor 114 of the output limiting circuit 400.

The transistors 304 and 308 perform an exclusive operation where one of them is turned on and the other is turned off, and an operation where both of them are turned off. The buffer circuit 301 outputs, to the clipping voltage supply portion 309, one of the voltage VCLIPH that is supplied from the voltage supply portion 302 and the voltage VCLIPL that is supplied from the voltage supply portion 305 according to the operating statuses of the transistors 304 and 308. The clipping voltage supply portion 309 is connected to the control line 120. The clipping voltage supply portion 309 outputs the voltage VCLIP to the control line 120.

Figure 15:
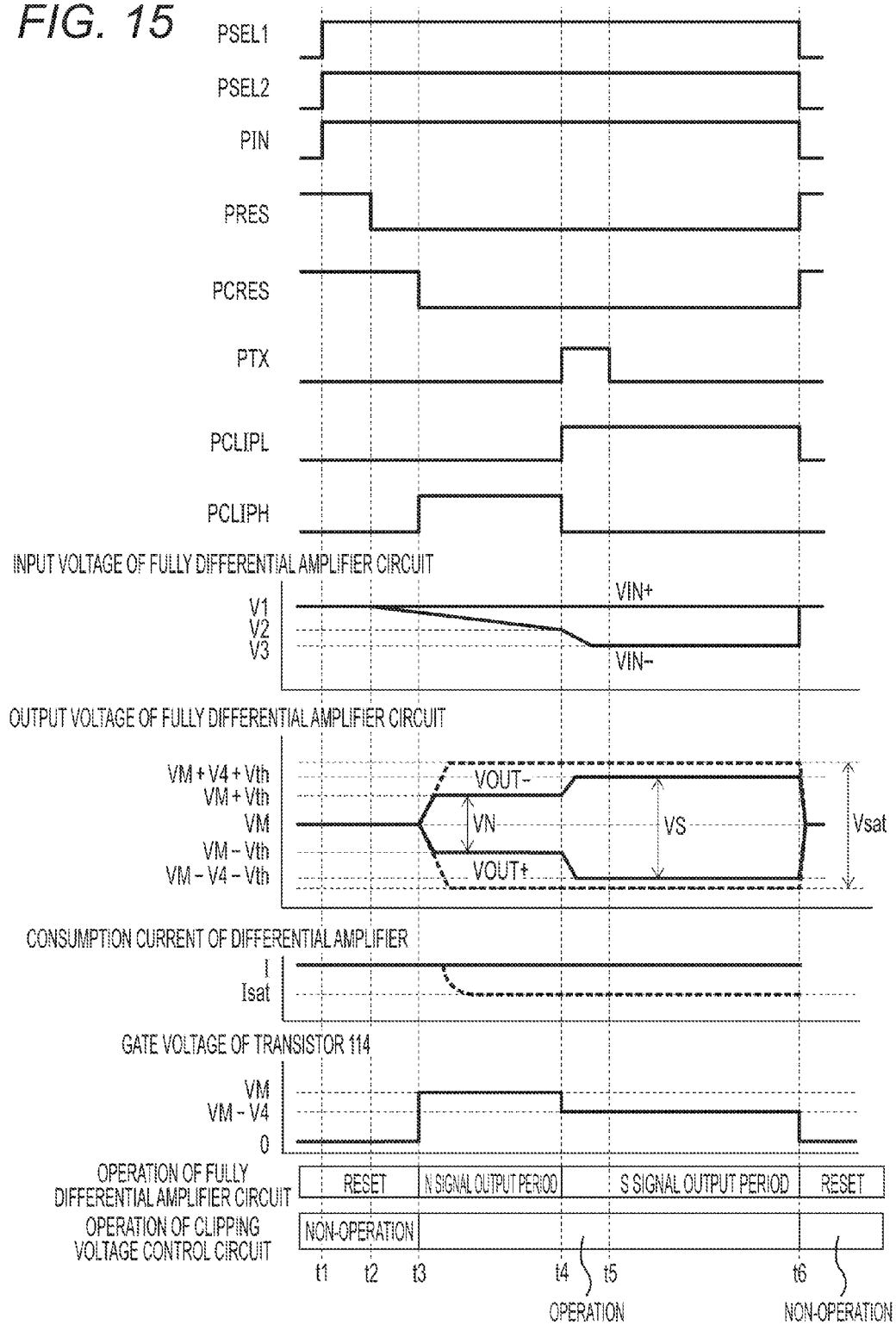
FIG. 15 is a diagram illustrating an example of the operation of the imaging apparatus.

FIG. 15 is a timing chart illustrating the operation of the imaging apparatus illustrated in FIG. 11.

Control signals illustrated in FIG. 15 correspond respectively to the signals illustrated in FIGS. 11 to 13. Each of the control signals illustrated in FIG. 15 turns on a transistor or switch into which the control signal is input, when its signal level goes to the High level. In other words, a control signal whose signal level is the High level is an active-level signal that activates a transistor or switch into which the control signal is input. Moreover, when the signal level of each signal illustrated in FIG. 15 goes to the Low level, a transistor or switch into which the signal is input is turned off. The High level is expressed below as the Hi level, and the Low level as the Lo level.

A signal PIN is a signal that is output by the unillustrated control circuit to the switches 110-1 and 110-2.

A signal PCRES is a signal that is output by the unillustrated control circuit to the switches 112-1 and 112-2.

At time t1, the unillustrated vertical scan circuit sets, to the Hi level, the signal level of the signal PSEL1 that is output to the gate of the transistor 206 of the effective pixel 100 located in a row selected as a row from which a signal is read out. Consequently, the transistor 205 of the effective pixel 100 outputs a signal at a potential based on the node FD to the first signal line 102.

Moreover, at time t1, the unillustrated vertical scan circuit sets the signal level of the signal PSEL2 to the Hi level. Consequently, the transistor 205 of the reference pixel 101 outputs a signal at a potential based on the node FD to the second signal line 103.

At time t1, the unillustrated vertical scan circuit sets, to the Hi level, the signal level of the signal PRES that is output to the gate of the transistor 204 of the effective pixel 100 and the gate of the transistor 204 of the reference pixel 101, which are located in a row from which a signal is read out. Consequently, the node FDs of the effective pixel 100 and the reference pixel 101 are in a reset state.

Moreover, at time t1, the unillustrated control circuit sets the signal level of the signal PIN to the Hi level. Consequently, the switches 110-1 and 110-2 are turned on. The turn-on of the switch 110-1 causes a signal output by the transistor 205 of the effective pixel 100 to the first signal line 102 to be input into the capacitive element C0-1. Moreover, the turn-on of the switch 110-2 causes a signal output by the transistor 205 of the reference pixel 101 to be input into the capacitive element C0-2.

At time t1, the unillustrated control circuit sets the signal level of the signal PCRES to the Hi level. Consequently, the fully differential amplifier circuit 180 is in the reset state since the switches 112-1 and 112-2 are on. At this point in time, both of the outputs VOUT− and VOUT+ of the fully differential amplifier circuit 180 are at a voltage VM.

At time t2, the unillustrated vertical scan circuit changes the signal level of the signal PRES to the Lo level. Consequently, the reset of the node FDs of the effective pixel 100 and the reference pixel 101 is canceled. A signal that is output by the transistor 205 of the effective pixel 100 based on the potential of the node FD where the reset has been canceled is expressed as the valid N signal. On the other hand, a signal that is output by the transistor 205 of the reference pixel 101 based on the potential of the node FD where the reset has been canceled is expressed as the reference N signal. At time t2, the potentials of both of the valid N signal and the reference N signal are at a potential V1.

FIG. 15 illustrates an example where intense light is incident on the photodiode 201 of the effective pixel 100. When intense light is incident on the photodiode 201 of the effective pixel 100, electric charge generated in the photodiode 201 leaks to the node FD irrespective of the fact that the transistor 202 is off. Consequently, the amplitude of the valid N signal output by the transistor 205 of the effective pixel 100 increases with the passage of time. Hence, the potential of the valid N signal decreases from the potential V1 with the passage of time.

At time t3, the unillustrated control circuit changes the signal level of the signal PCRES to the Lo level. Consequently, the switches 112-1 and 112-2 are turned off. Hence, the reset of the fully differential amplifier circuit 180 is canceled. The turn-off of the switch 112-1 causes the capacitive element C0-1 to clamp the valid N signal at time t3. Moreover, the turn-off of the switch 112-2 causes the capacitive element C0-2 to clamp the reference N signal at time t3.

Moreover, at time t3, the unillustrated control circuit changes the signal level of the signal PCLIPH to the Hi level. On the other hand, the unillustrated control circuit maintains the signal level of the signal PCLIPL at the Lo level. Consequently, the clipping voltage control circuit 115 outputs the voltage VCLIPH as the voltage VCLIP to the gate of the transistor 114.

Consequently, the transistor 114 limits an amplitude VN being the amplitude between the outputs VOUT− and VOUT+ of the fully differential amplifier circuit 180 into which the valid N signal and the reference N signal have been input in such a manner as not to become larger than a first amplitude range being a predetermined amplitude range. The amplitude VN is the amplitude of an amplified noise signal being a signal that is output by the fully differential amplifier circuit 180 based on the valid N signal and the reference N signal. The value of the voltage VCLIPH is set based on the value of the amplitude VN that is the limited amplitude between the outputs VOUT− and VOUT+ of the fully differential amplifier circuit 180. In the embodiment, the potential of the voltage VCLIPH is assumed to be the voltage VM being the same voltage as a signal output by the reset fully differential amplifier circuit 180. Let the threshold voltage of the transistor 114 be a voltage Vth. The output VOUT− of the fully differential amplifier circuit 180 is limited to a range up to a voltage VM+Vth. Moreover, the output VOUT+ of the fully differential amplifier circuit 180 is limited to a range up to a voltage VM−Vth. Hence, the amplitude where the amplitude VN of the fully differential amplifier circuit 180 is limited is a voltage 2Vth.

Up to this point the configuration where the transistor 114 limits the output of the fully differential amplifier circuit 180 has been described. As a comparative example, a configuration where the imaging apparatus does not include the transistor 114 is described here. In this case, the output of the fully differential amplifier circuit 180 is not limited by the transistor 114. Electric charge continues leaking from the photodiode 201 of the effective pixel 100 to the node FD, and accordingly, the amplitude of the valid N signal increases with the passage of time. Consequently, the amplitude VN of the signal output by the fully differential amplifier circuit 180 also increases with the passage of time. The amplitude VN then reaches an amplitude Vsat that is at the saturation level.

The description of the comparative example is continued.

The unillustrated vertical scan circuit then changes, to the Hi level, the signal level of the signal PTX that is output to the transistors 202 of the effective pixel 100 and the reference pixel 101 at time t4, and changes the signal level of the signal PTX to the Lo level at time t5. Consequently, in the effective pixel 100, the electric charge generated by the photodiode 201 is transferred to the node FD. Consequently, the node FD of the effective pixel 100 has a potential based on the electric charge accumulated in the photodiode 201. The transistor 205 of the effective pixel 100 outputs, to the first signal line 102, a signal based on the potential of the node FD that has now the potential based on the electric charge generated by the photodiode 201. The signal that is output by the transistor 205 of the effective pixel 100 to the first signal line 102 is expressed as the valid S signal. The potential of the valid S signal is a potential V3.

On the other hand, the potential of the node FD of the reference pixel 101 does not change significantly even if the signal PTX goes to the Hi level and then to the Lo level. A signal that is output to the second signal line 103 by the reference pixel 101 in response to the signal PTX going to the Lo level is expressed as the reference S signal. The potential of the reference S signal is the potential V1.

In the comparative example, the output of the fully differential amplifier circuit 180 reaches the saturation level before time t4 when the signal level of the signal PTX goes to the Hi level. Therefore, even if the valid S signal and the reference S signal are input into the fully differential amplifier circuit 180, an amplitude VS being the output of the fully differential amplifier circuit 180 is also at the saturation level. The amplitude VS is the amplitude of the amplified optical signal that is output by the fully differential amplifier circuit 180 based on the valid S signal and the reference S signal.

The fully differential amplifier circuit 180 inputs the amplitudes VN and VS into the signal processing circuit 113. The signal processing circuit performs a correlated double sampling (CDS; Correlated Double Sampling) process where the amplitude VN is subtracted from the amplitude VS. Consequently, it is possible to obtain a signal Vsig where a noise component included in the amplitude VS is subtracted. However, in the comparative example, both the amplitudes VS and VN are at the amplitude Vsat that is at the saturation level, in such a case as FIG. 15 where intense light is incident on the photodiode 201. Therefore, the signal Vsig is:

$$Vsig=VS-VN=Vsat-Vsat=0.$$

Therefore, the value of the signal Vsig is zero in spite of the effective pixel 100 on which intense light is incident. Hence, the blackening phenomenon in which a point corresponding to the effective pixel 100 including the photodiode 201 on which intense light is incident appears black and sunk occurs in an image generated using the signal Vsig.

Up to this point the comparative example where the blackening phenomenon occurs has been described. Now, let's return to the description of the embodiment.

Operations related to the signal PTX from time t4 to time t5 are the same as those of the above-mentioned comparative example. Consequently, the valid S signal and the reference S signal are input into the fully differential amplifier circuit 180.

Moreover, at time t4, the unillustrated control circuit changes the signal level of the signal PCLIPH to the Lo level, and changes the signal level of the signal PCLIPL to the Hi level. Consequently, the clipping voltage control circuit 115 outputs the voltage VCLIPL as the voltage VCLIP to the gate of the transistor 114. The voltage VCLIPL is set to a voltage whose amplitude VS does not reach the amplitude Vsat that is at the saturation level irrespective of the amplitude between the valid S signal and the reference S signal. In the embodiment, the voltage of the voltage VCLIPL is set to a voltage VM−V4 that is smaller by a voltage V4 than the voltage VM.

The transistor 114 limits the amplitude VS being the amplitude between the outputs VOUT− and VOUT+ of the fully differential amplifier circuit 180 into which the valid S signal and the reference S signal have been input in such a manner as not to become larger than a second amplitude range being a predetermined amplitude range. Therefore, the amplitude VS of a signal output by the fully differential amplifier circuit 180 does not reach the saturation level irrespective of the amplitude between the valid S signal and the reference S signal. The transistor 114 limits the output VOUT− of the fully differential amplifier circuit 180 to a range up to a voltage VM+V4+Vth. Moreover, the transistor 114 limits the output VOUT+ of the fully differential amplifier circuit 180 to a range up to a voltage VM−V4−Vth. Hence, the amplitude of the fully differential amplifier circuit 180 that is limited by the transistor 114 is a voltage 2V4+2Vth.

The signal processing circuit 113 obtains the signal Vsig by subtracting the amplitude VN from the amplitude VS as in the comparative example. If the amplitudes VS and VN are amplitudes limited by the transistor 114, the signal Vsig is:

$$Vsig=VS-VN=2V4+2Vth-2Vth=2V4$$

In the comparative example, Vsig=0 and the blackening phenomenon occurs. On the other hand, in the imaging apparatus of the embodiment, the imaging apparatus includes the transistor 114, and accordingly it is possible to make it hard for the blackening phenomenon to occur.

Moreover, the imaging apparatus of the embodiment can prevent both the amplitudes VN and VS of signals output by the fully differential amplifier circuit 180 from reaching the saturation level. If the amplitude of a signal output by the fully differential amplifier circuit 180 reaches the saturation level, a change occurs in the consumption current of the fully differential amplifier circuit 180. In the embodiment, the consumption current of the fully differential amplifier circuit 180 decreases. The change in the consumption current of the fully differential amplifier circuit 180 causes a change in the potential of a power supply line connected in common to a plurality of the fully differential amplifier circuits 180. Consequently, changes occur in signals of the fully differential amplifier circuits 180 around the fully differential amplifier circuit 180 that has reached the saturation level. Consequently, the smear phenomenon where a stripe like a horizontal streak is generated occurs in an image generated using signals output by the plurality of the fully differential amplifier circuits 180.

On the other hand, the imaging apparatus of the embodiment includes the transistor 114. Accordingly, it can be configured such that both the amplitudes VS and VN of signals output by the fully differential amplifier circuit 180 are prevented from reaching the saturation level. Consequently, it is possible to reduce a change in the consumption current of the fully differential amplifier circuit 180 resulting from the event where the output of the fully differential amplifier circuit 180 reaches the saturation level. Hence, the imaging apparatus of the embodiment can make it hard for the smear phenomenon to occur.

In this manner, the imaging apparatus of the embodiment includes the transistor 114 being the output limiting circuit that limits the output of the fully differential amplifier circuit 180. Consequently, the imaging apparatus of the embodiment can make it hard for the blackening phenomenon and the smear phenomenon to occur.

In the embodiment, the reference pixel 101 is placed between the effective pixel 100 belonging to the same pixel column and the column circuit 140. The embodiment is not limited to this example. Another example may be that the reference pixel 101 is provided such that the effective pixel 100 is placed between the reference pixel 101 and the column circuit 140. Moreover, all the effective pixels 100 belonging to one column may be placed in such a manner as to be included between a plurality of the reference pixels 101 in the one column of the effective pixels 100. In this case, it may be configured such that the reference pixel 101 provided such that the effective pixels 100 are placed between the reference pixel 101 and the column circuit 140 reads out or does not read out a signal.

The embodiment describes that the clipping voltage control circuit 115 is included in the imaging apparatus. However, the embodiment is not limited to this example. For example, the voltage VCLIP may be input from the outside of the imaging apparatus.

Moreover, the amplification factor of the fully differential amplifier circuit 180 may be variable or fixed. Moreover, the case where the amplification factor of the fully differential amplifier circuit 180 is one also falls under the category of the amplification operation.

Moreover, in the embodiment, the configuration is described in which the reference pixel 101 includes the capacitive element 211 instead of the photodiode 201. The embodiment is not limited to this example. The reference pixel 101 is simply required to be a pixel that outputs a noise-level signal, and have the configuration including the transistors 204, 205, and 206. Moreover, the reference pixel 101 may be configured including the photodiode 201 and the transistors 202, 204, 205, and 206 as in the effective pixel 100. In this case, the reference pixel 101 can be an optical black pixel having the light-shielding photodiode 201.

Moreover, in the embodiment, the configuration is described in which the effective pixel 100 and the reference pixel 101 each have the transistor 206. The embodiment is not limited to this example. It can be configured such that the effective pixel 100 and the reference pixel 101 do not include the transistor 206. In this case, the selection of the effective pixel 100 that outputs a signal to the first signal line 102 from the plurality of effective pixels 100 is controlled by the reset potential of the node FD. In other words, the power supply voltage Vdd fed to one of main nodes of the transistor 204 is set to a voltage that turns off the transistor 205, for the effective pixel 100 that does not output a signal to the first signal line 102 among the plurality of effective pixels 100. The unillustrated vertical scan circuit changes the signal level of the signal PRES to the Hi level and feeds the node FD with a voltage that turns off the transistor 205. Consequently, the transistor 205 of the effective pixel 100 that does not output a signal to the first signal line 102 among the plurality of effective pixels 100 is turned off. On the other hand, the power supply voltage Vdd fed to the one main node of the transistor 204 is set to a voltage that turns on the transistor 205, for the effective pixel 100 that outputs a signal to the first signal line 102. The unillustrated vertical scan circuit changes the signal level of the signal PRES to the Hi level and feeds the node FD with the voltage that turns on the transistor 205. Consequently, the transistor 205 of the effective pixel 100 that outputs a signal to the first signal line 102 among the plurality of effective pixels 100 is turned on. In this manner, even if the effective pixel 100 does not include the transistor 206, it is possible to select the effective pixel 100 that outputs a signal to the first signal line 102 from the plurality of effective pixels 100. A method for selecting the reference pixel 101 that outputs a signal to the second signal line 103 from the plurality of reference pixels 101, each of which does not include the transistor 206, is also the same as the above-mentioned method for selecting the effective pixel 100.

Sixth Embodiment

An imaging apparatus of the embodiment is described focusing on points different from those of the fifth embodiment.

The entire configuration of the imaging apparatus of the embodiment is the same as that of the imaging apparatus illustrated in FIG. 11 of the fifth embodiment. Moreover, the operation of the imaging apparatus of the embodiment is the same as that of the imaging apparatus illustrated in the fifth embodiment.

Figure 16:
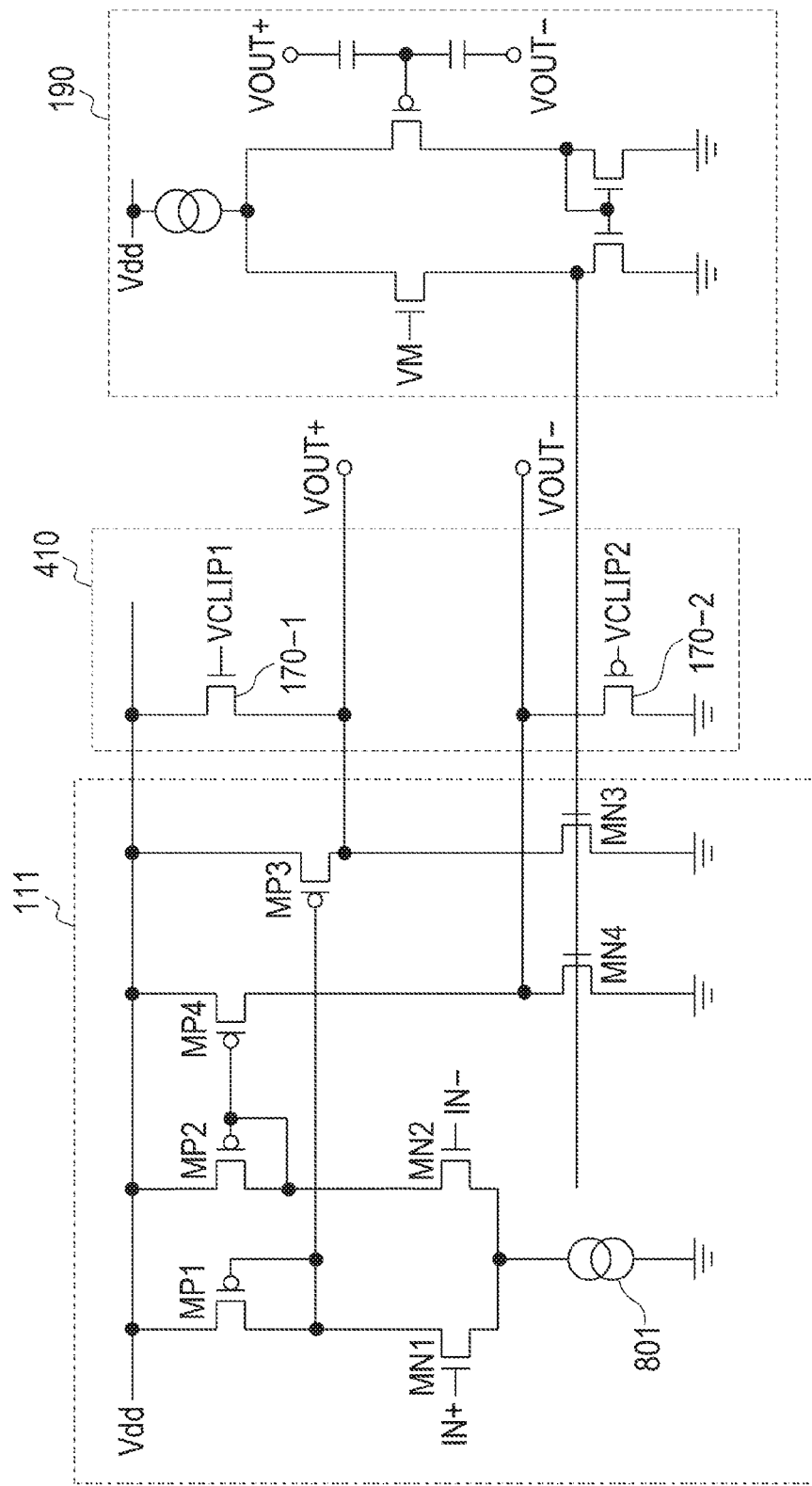
FIG. 16 is a diagram illustrating an example of the configuration of a differential amplifier, an output limiting circuit, and a CMFB circuit.

FIG. 16 is a diagram illustrating a combination of the differential amplifier 111, a common feedback circuit (CMFB circuit) 190, and an output limiting circuit 410 of the embodiment.

The differential amplifier 111 includes PMOS transistors MP1 to MP4. Moreover, the differential amplifier 111 includes NMOS transistors MN1 to MN4. Moreover, the differential amplifier 111 includes a current source 801. A differential stage of the differential amplifier 111 includes the PMOS transistors MP1 and MP2, the NMOS transistors MN1 and MN2, and the current source 801. An output stage of the differential amplifier 111 includes the PMOS transistors MP3 and MP4, and the NMOS transistors MN3 and MN4. The output stage can be said to include a common-source amplifier circuit including the PMOS transistor MP3 and the NMOS transistor MN3, and a common-source amplifier circuit including the PMOS transistor MP4 and the NMOS transistor MN4. The CMFB circuit 190 is a circuit that operates such that an average voltage of the outputs VOUT− and VOUT+ of the fully differential amplifier circuit 180 agrees with the voltage VM.

Moreover, the configuration illustrated in FIG. 16 includes the output limiting circuit 410, which corresponds to transistors 170-1 and 170-2. The power supply voltage Vdd is input into one of main nodes of the transistor 170-1, and the output VOUT+ is input into the other main node. A voltage VCLIP1 is input into the transistor 170-1. A ground potential is input into one of main nodes of the transistor 170-2, and the output VOUT− is input into the other main node. A voltage VCLIP2 is input into a gate of the transistor 170-2. The values of the voltage VCLIP1 and the voltage VCLIP2 are respectively set based on the ranges limiting the amplitudes VN and VS of the outputs of the fully differential amplifier circuit 180, as appropriate.

Also in the configuration, the imaging apparatus of the embodiment can have the same effect as that of the fifth embodiment.

Seventh Embodiment

An imaging apparatus of the embodiment is described focusing on points different from those of the sixth embodiment.

Figure 17:
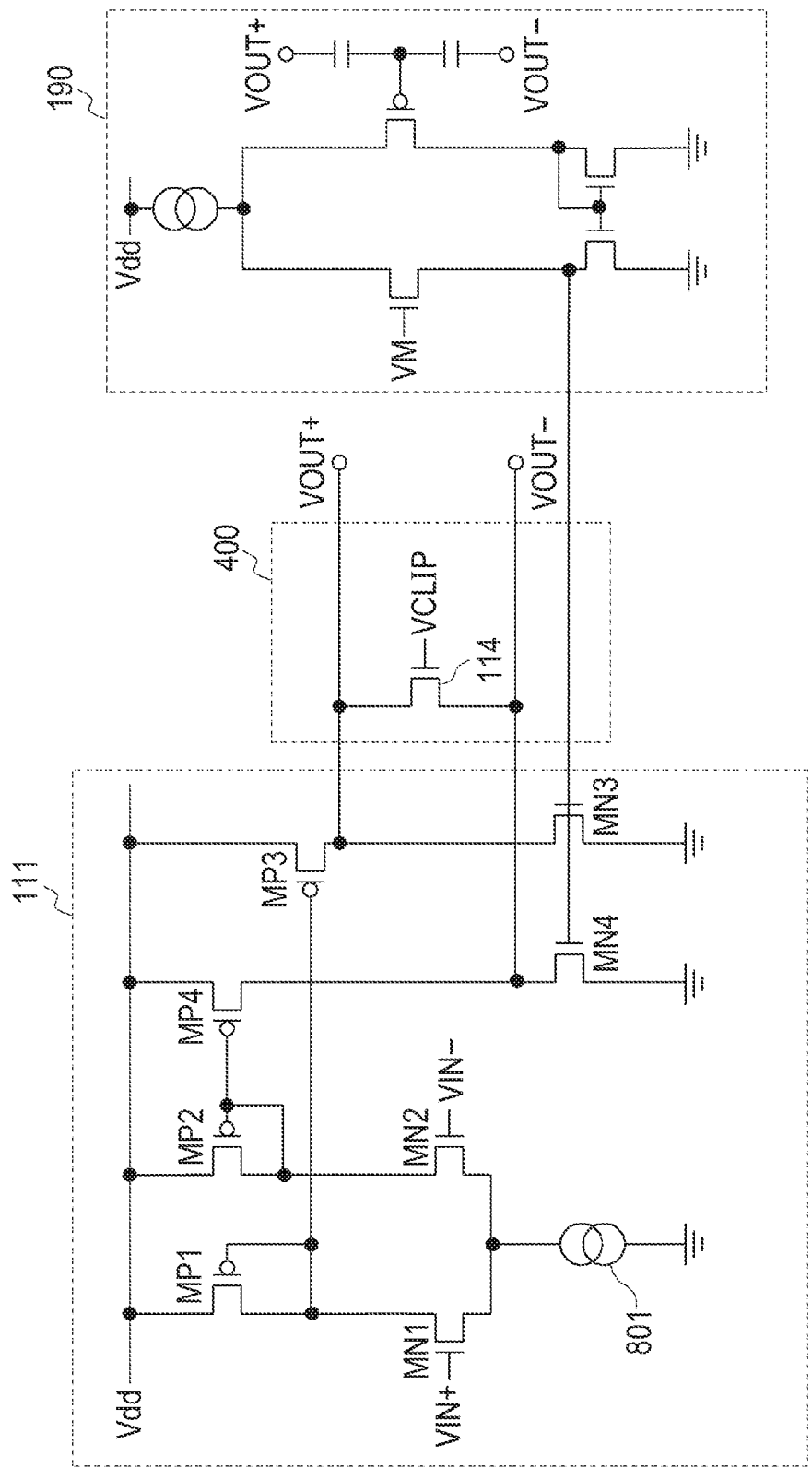
FIG. 17 is a diagram illustrating an example of the configuration of the differential amplifier, the output limiting circuit, and the CMFB circuit.

FIG. 17 is a diagram illustrating the configuration of the differential amplifier 111, an output limiting circuit, and the CMFB circuit 190 of the embodiment. The output limiting circuit of the embodiment is the transistor 114 as in the fifth embodiment.

In a case of the configuration illustrated as FIG. 16 in the sixth embodiment, if the transistors 170-1 and 170-2 are not operating, currents Ia flow through the NMOS transistors MN3 and MN4 respectively. Hence, the current flowing through the output stage including the two common-source amplifier circuits in each of which the current Ia flows becomes a current 2Ia. On the other hand, if the amplitude of the output of the fully differential amplifier circuit 180 increases and each of the transistors 170-1 and 170-2 limits the output of the fully differential amplifier circuit 180, currents also flow through the transistors 170-1 and 170-2. Specifically, a current that flows into a ground node that supplies a ground potential from the power supply voltage Vdd via the transistor 170-1 and the NMOS transistor MN3 is generated in the transistor 170-1. Likewise, a current that flows into a ground node from the power supply voltage Vdd via the PMOS transistor MP4 and the transistor 170-2 is generated in the transistor 170-2. Let the current flowing through the transistor 170-1 be a current Ib, and let the current flowing through the transistor 170-2 be a current Ic. A current flowing through the output stage when the transistors 170-1 and 170-2 operate is a current 2Ia+Ib+Ic. Hence, the amount of the consumption current of the output stage is increased by the operation of the transistors 170-1 and 170-2.

On the other hand, in the configuration illustrated in FIG. 17, the transistor 114 being the output limiting circuit is fed at one of main nodes with the output VOUT+, and at the other main node with the output VOUT−. In this case, when the transistor 114 operates, a current Ie flows through the transistor 114 from the output VOUT− to the output VOUT+. Hence, the current flowing through the NMOS transistor MN4 is a current Ia+Ie. On the other hand, the current flowing through the NMOS transistor MN3 is a current Ia−Ie. Hence, the consumption current of the two common-source amplifier circuits in the output stage remains unchanged at the current 2Ia even if the transistor 114 operates. As illustrated in FIG. 17, in the imaging apparatus of the embodiment, one of main nodes of the transistor 114 being the output limiting circuit is connected to one of output nodes of the fully differential amplifier circuit 180, and the other main node is connected to the other output node of the fully differential amplifier circuit 180. Consequently, a change in the amount of the consumption current of the fully differential amplifier circuit 180 between the operating state and the non-operating state of the transistor 114 can be reduced as compared to the configuration of FIG. 16. Hence, the imaging apparatus of the embodiment can prevent potential changes in the power supply voltage Vdd and ground potential resulting from the operation of the output limiting circuit. Consequently, it is possible to make it hard for the smear phenomenon resulting from the operation of the output limiting circuit to occur.

Eighth Embodiment

An imaging apparatus of the embodiment is described focusing on points different from those of the seventh embodiment.

Figure 18:
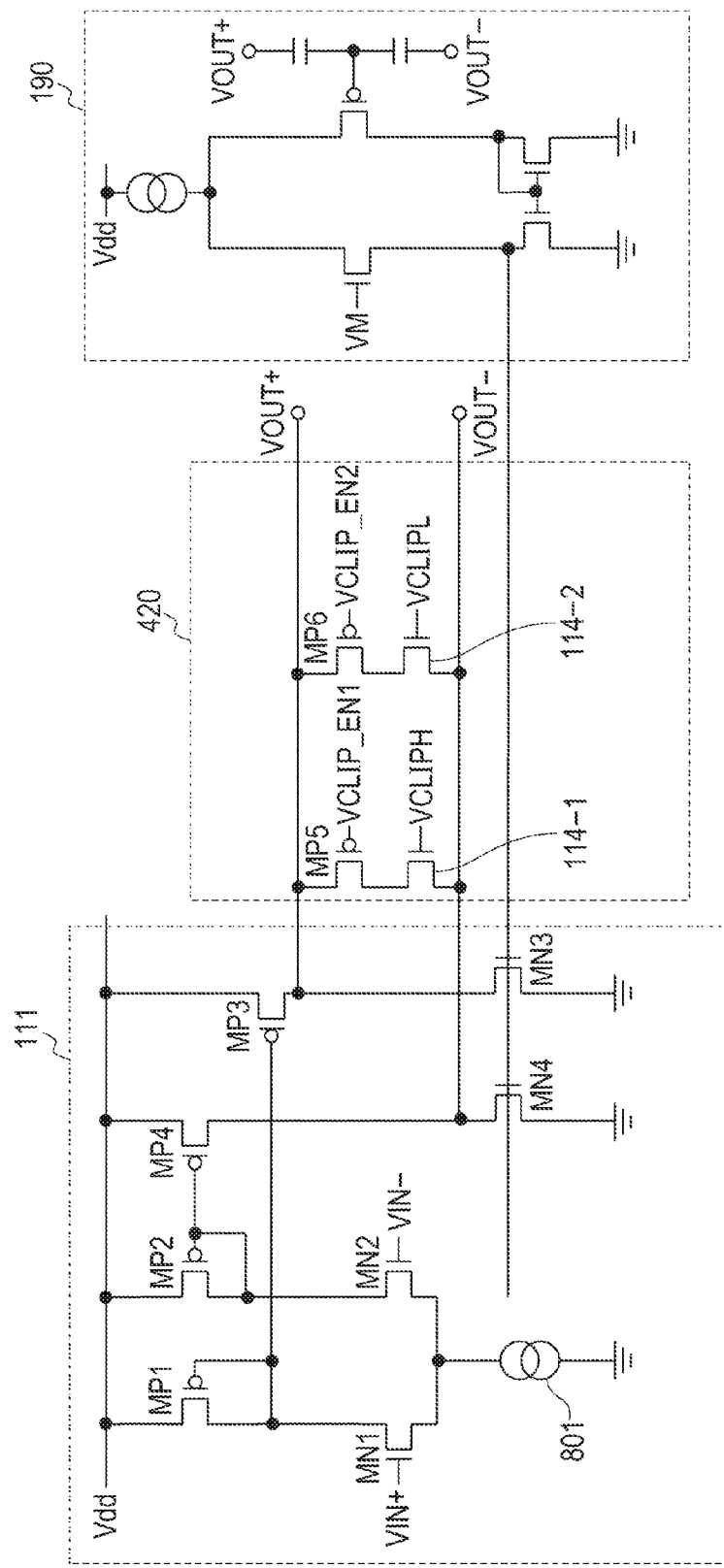
FIG. 18 is a diagram illustrating an example of the configuration of the differential amplifier, the output limiting circuit, and the CMFB circuit.

FIG. 18 is a diagram illustrating the differential amplifier 111, an output limiting circuit, and the CMFB circuit 190 of the imaging apparatus of the embodiment. Nodes of the differential amplifier 111 that outputs the output VOUT+ and that outputs the output VOUT− correspond to the first and second output nodes of the fully differential amplifier circuit 180 respectively. The output limiting circuit of the embodiment includes PMOS transistors MP5 and MP6, and transistors 114-1 and 114-2. An unillustrated control circuit inputs a signal VCLIP_EN1 into a gate of the PMOS transistor MP5. Moreover, the unillustrated control circuit inputs a signal VCLIP_EN2 into a gate of the PMOS transistor MP6. The PMOS transistor MP5 is a first switch provided between the transistor 114-1 being a first transistor and the first output node of the fully differential amplifier circuit 180. The PMOS transistor MP6 is a second switch provided between the transistor 114-2 being a second transistor and the first output node of the fully differential amplifier circuit 180.

The voltage VCLIPH is input into a gate of the transistor 114-1. The voltage VCLIPL is input into a gate of the transistor 114-2.

The unillustrated control circuit sets the signal level of the signal VCLIP_EN1 to the active level from time t3 to time t4 during which the signal level of the signal PCLIPH is set to the active level (Hi level) in the timing chart illustrated in FIG. 15. The active level of the signal VCLIP_EN1 is the Lo level since it is a signal that is input into the PMOS transistor. Consequently, the transistor 114-1 can operate during a period of time from time t3 to time t4.

The unillustrated control circuit sets the signal level of the signal VCLIP_EN2 to the active level from time t4 to time t6 during which the signal level of the signal PCLIPL is set to the active level (Hi level) in the timing chart illustrated in FIG. 15. The active level of the signal VCLIP_EN2 is the Lo level since it is a signal that is input into the PMOS transistor. Consequently, the transistor 114-2 can operate during a period of time from time t4 to time t6.

In the imaging apparatus of the fifth embodiment, the buffer circuit 301 of the clipping voltage control circuit 115 outputs the voltage VCLIPL and the voltage VCLIPH via the control line 120 connected in common to the plurality of column circuits 140. The control line 120 is connected to the plurality of column circuits 140. Accordingly, if the number of column circuits 140 reaches several thousands, the parasitic capacitance of the control line 120 becomes large. It takes the buffer circuit 301 a long time from starting switching the voltage VCLIP that is supplied to the control line 120 between the voltage VCLIPL and the voltage VCLIPH and settling the voltage VCLIP, due to the parasitic capacitance. Alternatively, if an attempt is made to switch between the voltages VCLIPL and VCLIPH at high speed, it is necessary to make the drive force of the buffer circuit 301 large.

On the other hand, the imaging apparatus of the embodiment has the effect that it is possible to switch the amplitude limited by the output limiting circuit at higher speed than the configuration of the clipping voltage control circuit 115 of the fifth embodiment by controlling the signals VCLIP_EN1 and VCLIP_EN2.

Ninth Embodiment

An imaging apparatus of the embodiment is described focusing on points different from those of the eighth embodiment.

FIG. 19A is a diagram illustrating the configuration of the column circuit 140 of the imaging apparatus of the embodiment. In FIG. 19A, the same reference numerals as those assigned in FIG. 13 are also assigned to and represent members having the same functions as the reference numerals assigned in FIG. 13. The column circuit 140 of the imaging apparatus of the embodiment includes a first fully differential amplifier circuit 300 and a second fully differential amplifier circuit 310. Furthermore, the column circuit 140 includes an output limiting circuit 500 and a second output limiting circuit 510.

The configuration of the first fully differential amplifier circuit 300 is the same as that of the fully differential amplifier circuit 180 illustrated in FIG. 13. Moreover, the circuit configuration of the second fully differential amplifier circuit 310 is the same as that of the first fully differential amplifier circuit 300. The outputs of the second fully differential amplifier circuit 310 are input into the signal processing circuit 113. A node of the second fully differential amplifier circuit 310 from which an output VOUT2+ is output is a third output node. A node of the second fully differential amplifier circuit 310 from which an output VOUT2− is output is a fourth output node. An input node (first input node) of the second fully differential amplifier circuit 310 is connected to a node from which the output VOUT+ is output, which is a first output node of the first fully differential amplifier circuit 300. Moreover, an input node (second input node) of the second fully differential amplifier circuit 310 is connected to a node from which the output VOUT− is output, which is a second output node of the first fully differential amplifier circuit 300.

An amplified noise signal and amplified optical signal that are output by the first fully differential amplifier circuit 300 are input to the second fully differential amplifier circuit 310. The second fully differential amplifier circuit 310 outputs a second amplified noise signal amplified from the amplified noise signal from the third and fourth output nodes. Moreover, the second fully differential amplifier circuit 310 outputs a second amplified optical signal amplified from the amplified optical signal from the third and fourth output nodes.

FIG. 19B is a diagram illustrating the configuration of the output limiting circuit 500. The output limiting circuit 500 illustrated in FIG. 19B is the same as the output limiting circuit 420 illustrated in FIG. 18.

FIG. 19C is a diagram illustrating the configuration of the second output limiting circuit 510. The second output limiting circuit 510 includes PMOS transistors MP7 and MP8, and transistors 114-3 and 114-4.

An unillustrated control circuit inputs the signal VCLIP_EN1 into a gate of the PMOS transistor MP5 of the output limiting circuit 500. Moreover, the unillustrated control circuit inputs the signal VCLIP_EN2 into a gate of the PMOS transistor MP6 of the output limiting circuit 500.

The unillustrated control circuit inputs a signal VCLIP_EN3 into a gate of the PMOS transistor MP7 of the second output limiting circuit 510. Moreover, the unillustrated control circuit inputs a signal VCLIP_EN4 into a gate of the PMOS transistor MP8 of the second output limiting circuit 510.

The voltage VCLIPH is input into the gate of the transistor 114-1 of the output limiting circuit 500. Moreover, a voltage VCLIPL1 is input into the gate of the transistor 114-2 of the output limiting circuit 500. The voltage VCLIPL1 is the same voltage as the voltage VCLIPL described in the fifth embodiment.

The voltage VCLIPH is input into a gate of the transistor 114-3 of the second output limiting circuit 510. The common voltage VCLIPH is input into the transistors 114-1 and 114-3. Consequently, both the first and second amplified noise signals are limited to the first amplitude range. A voltage VCLIPL2 is input into a gate of the transistor 114-4 of the second output limiting circuit 510. In the embodiment, the voltage VCLIPL2 is a voltage VM−V8 that is smaller by a voltage V8 from the voltage VM.

The PMOS transistor MP7 of the second output limiting circuit 510 is a third switch provided between the transistor 114-3 being a third transistor and the third output node of the second fully differential amplifier circuit 310. The PMOS transistor MP8 of the second output limiting circuit 510 is a fourth switch provided between the transistor 114-4 being a fourth transistor and the third output node of the second fully differential amplifier circuit 310.

The voltage VCLIPH that is input into the gate being the control node of the transistor 114-3 being the third transistor is a third voltage. Moreover, the voltage VCLIPL2 that is input into the gate being the control node of the transistor 114-4 being the fourth transistor is a fourth voltage.

Figure 20:
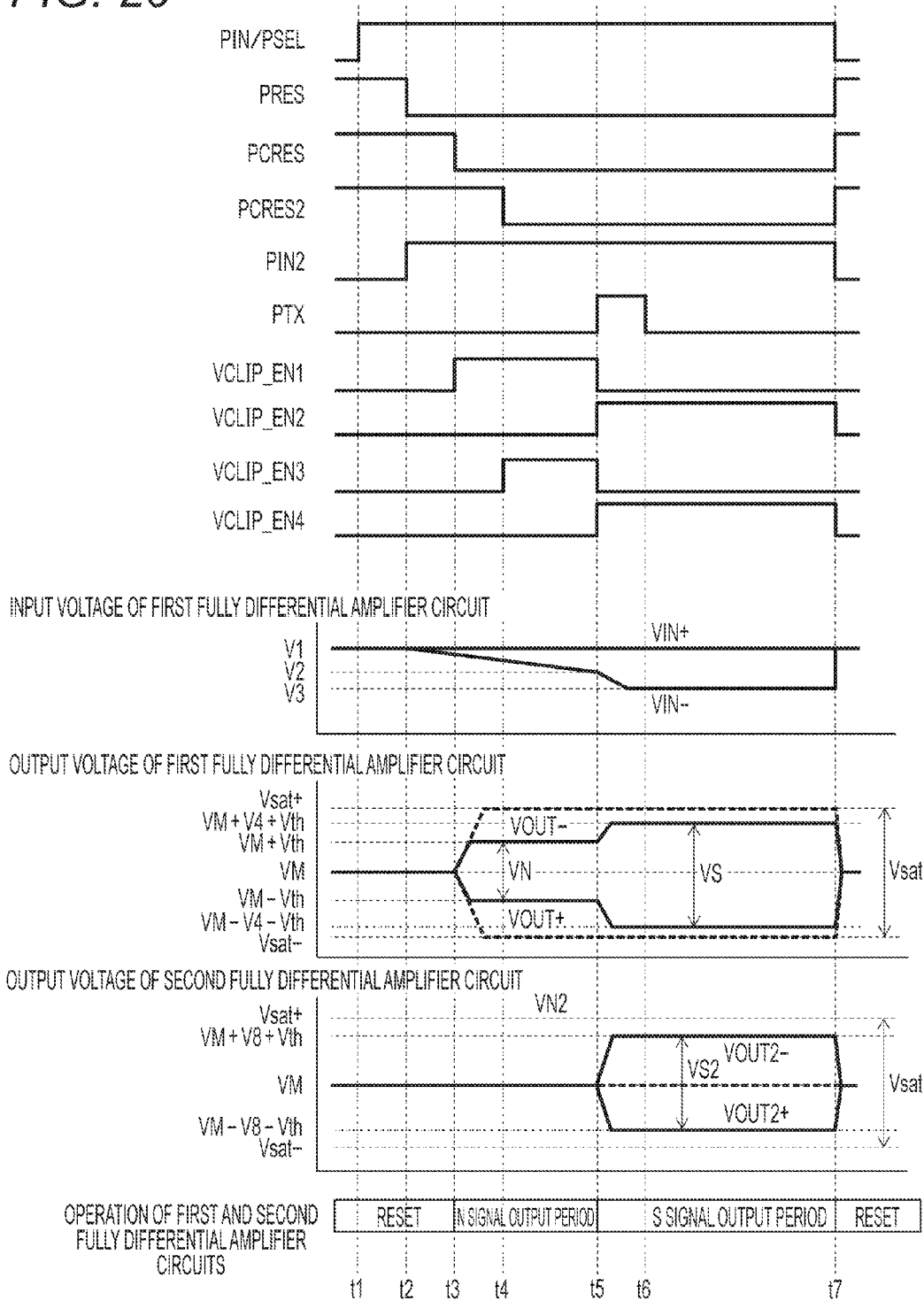
FIG. 20 is a diagram illustrating an example of the operation of the imaging apparatus.

FIG. 20 is a diagram illustrating the operation of the imaging apparatus of the embodiment. A signal PIN2 illustrated in FIG. 20 is a signal that controls switches 910-1 and 910-2 illustrated in FIG. 19A.

Moreover, a signal PCRES2 is a signal that controls switches 911-1 and 911-2.

At time t3, the unillustrated control circuit changes the signal level of the signal PCRES to the Lo level, and changes the signal level of the signal VCLIP_EN1 to the Hi level.

At time t4, the unillustrated control circuit changes the signal level of the signal PCRES2 to the Lo level, and changes the signal level of the signal VCLIP_EN3 to the Hi level.

At time t5, an unillustrated vertical scan circuit changes the signal level of the signal PTX to the Hi level. Moreover, at time t5, the unillustrated control circuit changes the signal level of the signals VCLIP_EN1 and VCLIP_EN3 to the Lo level, and changes the signal level of the signals VCLIP_EN2 and VCLIP_EN4 to the Hi level.

At time t7, the unillustrated control circuit changes the signal level of the signals VCLIP_EN2 and VCLIP_EN4 to the Lo level.

The imaging apparatus of the embodiment is provided with the output limiting circuits corresponding respectively to the first fully differential amplifier circuit 300 and the second fully differential amplifier circuit 310. Consequently, the outputs of both of the first fully differential amplifier circuit 300 and the second fully differential amplifier circuit 310 are limited in such a manner as to prevent them from reaching the saturation level. Consequently, it is possible to make it hard for the smear phenomenon resulting from a change in power supply voltage caused by the outputs of the first fully differential amplifier circuit 300 and the second fully differential amplifier circuit 310 reaching the saturation levels to occur.

Moreover, in the operations illustrated in FIG. 20, after the amplitude VN of the output of the first fully differential amplifier circuit 300 reaches the level of a limit by the output limiting circuit 500, the reset of the second fully differential amplifier circuit 310 is canceled. For example, when the amplitude VN of the output of the first fully differential amplifier circuit 300 changes, if the reset of the second fully differential amplifier circuit 310 is canceled, a signal that is input into the second fully differential amplifier circuit 310 also changes during a period of time from time t4 to time t5. Consequently, an amplitude VN2 of a signal that is output by the second fully differential amplifier circuit 310 from time t4 to time t5 increases. If the output is not limited by the second output limiting circuit 510, the amplitude VN2 may reach the saturation level depending on the amplification factor set for the second fully differential amplifier circuit 310. On the other hand, in the imaging apparatus of the embodiment, the second output limiting circuit 510 also limits the amplitude VN2 in such a manner as to prevent it from reaching the saturation level. Hence, the imaging apparatus including the first fully differential amplifier circuit 300 and the second fully differential amplifier circuit 310 of the embodiment can make it hard for the blackening phenomenon to occur by including the output limiting circuit 500 and the second output limiting circuit 510.

In the embodiment, the voltages VCLIPL1 and VCLIPL2 are described as different voltages, but may be the same voltage. In this case, both of the first and second amplified optical signals are limited to the second amplitude range.

Moreover, the amplification factors of the first fully differential amplifier circuit 300 and the second fully differential amplifier circuit 310 may be variable or fixed. Moreover, the amplification factor of the fully differential amplifier circuit 180 may be variable or fixed. Moreover, even if the amplification factor of the first fully differential amplifier circuit 300 is one, it falls under the category of the amplification operation. Moreover, even if the amplification factor of the second fully differential amplifier circuit 310 is one, it falls under the category of the amplification operation.

Tenth Embodiment

An imaging apparatus of the embodiment is described focusing on points different from those of the fifth embodiment.

Figure 21:
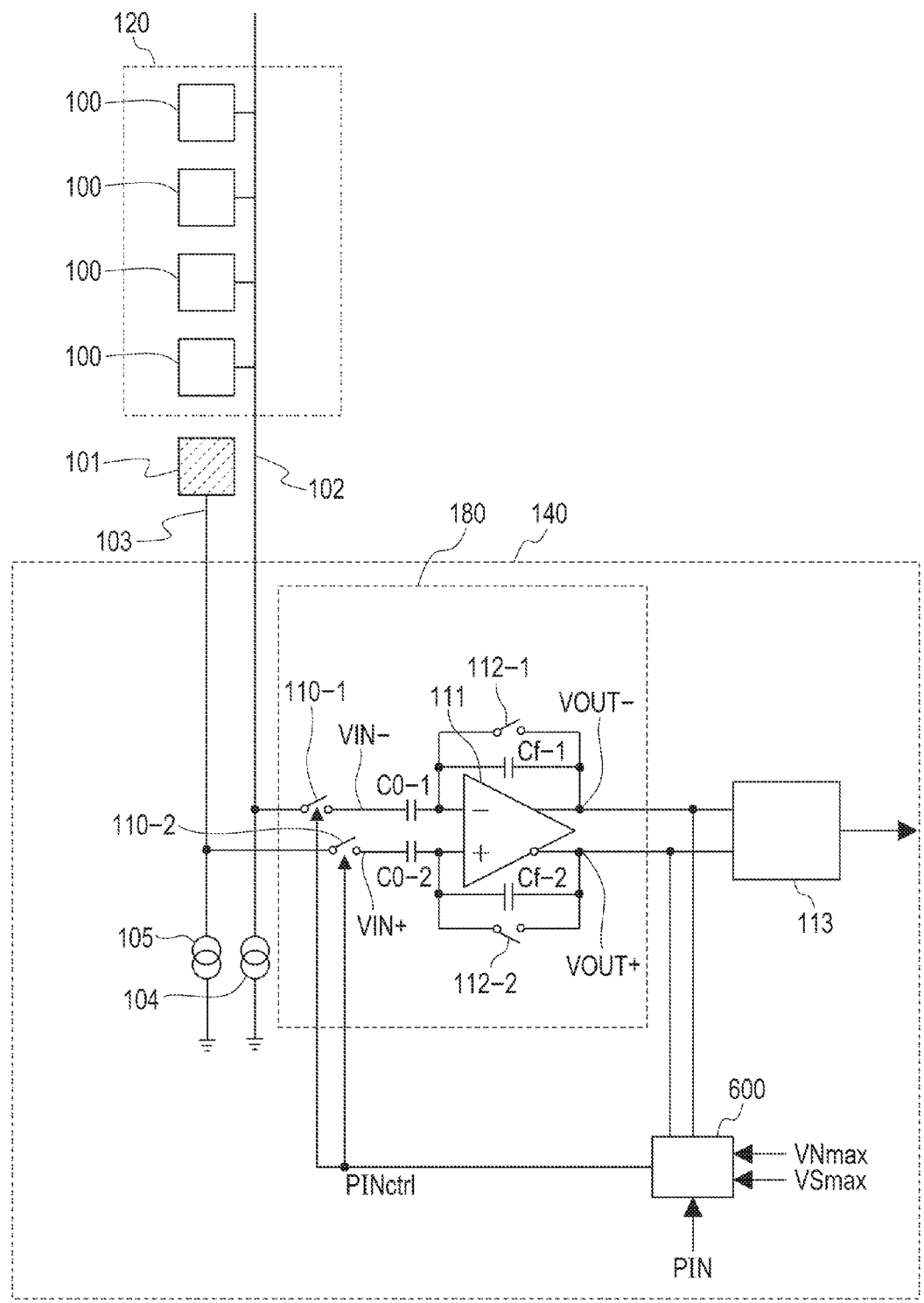
FIG. 21 is a diagram illustrating an example of the configuration of the column circuit.

FIG. 21 is a diagram illustrating an example of the configuration of the imaging apparatus of the embodiment.

In FIG. 21, the same reference numerals as those assigned in FIG. 13 are also assigned in FIG. 21 to members having the same functions as those illustrated in FIG. 13.

The column circuit 140 includes an output limiting circuit 600. In terms of the output limiting circuit 600, an unillustrated control circuit inputs setting information VNmax and setting information VSmax into the imaging apparatus from the outside. The setting information VNmax and the setting information VSmax each have an amplitude smaller than the saturation level Vsat of the output of the fully differential amplifier circuit 180. Moreover, the unillustrated control circuit inputs the signal PIN. The outputs VOUT+ and VOUT− of the fully differential amplifier circuit 180 are input into the output limiting circuit 600. The output limiting circuit 600 compares the amplitude VN output based on the valid N signal and the reference N signal with the setting information VNmax. The output limiting circuit 600 outputs a signal PINctrl to the switches 110-1 and 110-2 based on the result of the comparison of the amplitude VN and the setting information VNmax and the signal PIN. Specifically, when the amplitude VN has reached the setting information VNmax, the output limiting circuit 600 changes the signal level of the signal PINctrl to the Lo level. Consequently, the switches 110-1 and 110-2 are turned off. Hence, the amplitude VN is limited to the value of the setting information VNmax.

Moreover, the output limiting circuit 600 compares the amplitude VS output based on the valid S signal and the reference S signal with the setting information VSmax. The output limiting circuit 600 outputs the signal PINctrl to the switches 110-1 and 110-2 based on the result of the comparison of the amplitude VS and the setting information VSmax and the signal PIN. Specifically, when the amplitude VS has reached the setting information VSmax, the output limiting circuit 600 changes the signal level of the signal PINctrl to the Lo level. Consequently, the switches 110-1 and 110-2 are turned off. Hence, the amplitude VS is limited to the value of the setting information VSmax.

In this manner, also in the imaging apparatus of the embodiment, the output of the fully differential amplifier circuit 180 is limited by the output limiting circuit. Therefore, the imaging apparatus of the embodiment can also obtain the same effect as that of the fifth embodiment.

Eleventh Embodiment

The embodiment relates to an imaging system including the imaging apparatuses of the first to tenth embodiments.

Figure 22:
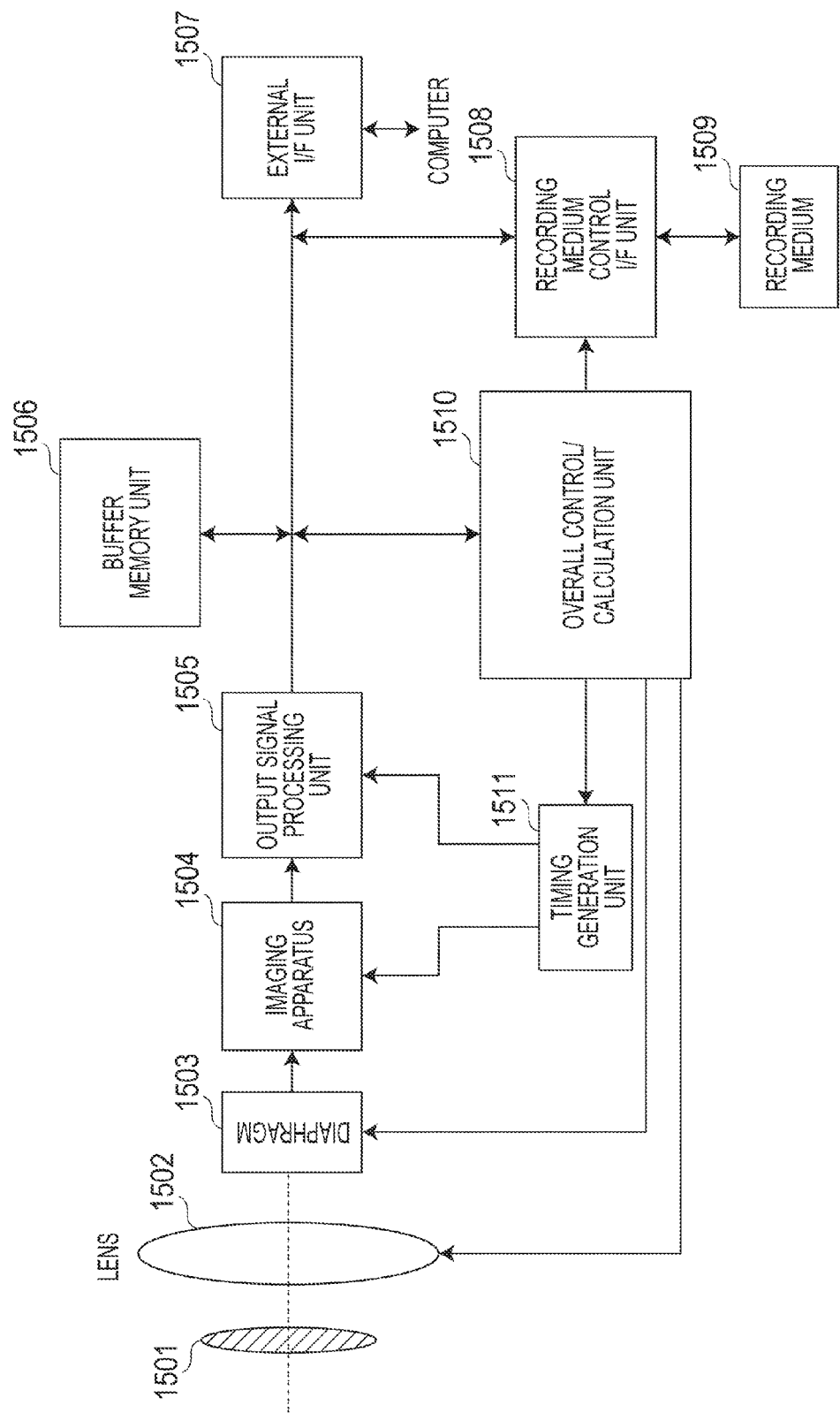
FIG. 22 is a diagram illustrating an example of an imaging system.

Examples of the imaging system include a digital still camera, a digital camcorder, and a monitoring camera. FIG. 22 illustrates a schematic diagram of when the imaging apparatus is applied to a digital still camera as an example of the imaging system.

The imaging system illustrated by example in FIG. 22 includes a barrier 1501 for protecting a lens, a lens 1502 that forms an optical image of a subject on an imaging apparatus 1504, and a diaphragm 1503 for making the amount of light passing through the lens 1502 variable. The lens 1502 and the diaphragm 1503 are an optical system that condenses light onto the imaging apparatus 1504. Moreover, the imaging system illustrated by example in FIG. 22 includes an output signal processing unit 1505 that processes an output signal that is output by the imaging apparatus 1504. The output signal processing unit 1505 performs an operation of making various corrections, performing compression, and outputting a signal where needed.

The imaging system illustrated by example in FIG. 22 further includes a buffer memory unit 1506 for temporarily storing image data, and an external interface unit 1507 for communicating with an external computer and the like. Furthermore, the imaging system includes a recording medium 1509 that is detachably mounted such as a semiconductor memory for recording and reading out imaging data, and a recording medium control interface unit 1508 for recording in and readout from the recording medium 1509. Furthermore, the imaging system includes an overall control/calculation unit 1510 that controls various operations and the entire digital still camera, and a timing supply unit 1511 that outputs various timing signals to the imaging apparatus 1504 and the output signal processing unit 1505. The timing signal and the like may be input from the outside. The imaging system is simply required to include at least the imaging apparatus 1504 and the output signal processing unit 1505 that processes an output signal that is output from the imaging apparatus 1504.

As described above, the imaging system of the embodiment can perform an imaging operation by the application of the imaging apparatus 1504.

Any of the above embodiments is an illustration of a specific example upon carrying out the disclosure. They are not intended to restrictively interpret the technical scope of the disclosure. In other words, the disclosure can be carried out in various forms without departing from its technical idea or main features. Moreover, the disclosure can be carried out by combining various embodiments described above.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-163159, filed Aug. 20, 2015, No. 2015-163160, filed Aug. 20, 2015, which are hereby incorporated by reference herein in their entirety.

What is claimed is:

1. An imaging apparatus comprising:
a pixel including an amplifier transistor configured to output a noise signal and an optical signal based on light;
an amplification circuit into which the noise signal and the optical signal are input from the amplifier transistor, the amplification circuit including a first and a second amplifier circuit; and
a limiter circuit connected to an output node of the first amplifier circuit, wherein
the first amplifier circuit outputs, to the second amplifier circuit, a first reference signal amplified from the noise signal, and a first optical signal amplified from the optical signal,
the second amplifier circuit includes a capacitive element and an amplifier,
the limiter circuit limits the amplitude of the first reference signal output by the first amplifier circuit,
the capacitive element is provided on an electric path between the limiter circuit and an input node of the amplifier, and
the capacitive element clamps the first reference signal whose amplitude is limited by the limiter circuit.

2. The imaging apparatus according to claim 1, wherein
a difference signal being a difference between the first optical signal and the first reference signal clamped by the capacitive element is input into the amplifier of the second amplifier circuit, and
the second amplifier circuit outputs a second optical signal being a signal amplified from the difference signal.

3. The imaging apparatus according to claim 2, wherein
the second amplifier circuit further outputs a second reference signal based on the first reference signal clamped by the capacitive element, and
the imaging apparatus further comprises a second limiter circuit configured to limit amplitudes of the second reference signal and the second optical signal.

4. The imaging apparatus according to claim 1, wherein both of the first amplifier circuit and the second amplifier circuit are fully differential amplifier circuits.

5. The imaging apparatus according to claim 1, wherein the amplitude of the first optical signal limited by the limiter circuit is larger than the amplitude of the first reference signal limited by the limiter circuit.

6. An imaging apparatus comprising:
a pixel including an amplifier transistor configured to output a noise signal and an optical signal based on light;
a fully differential amplifier circuit into which the optical signal is input from the amplifier transistor; and
an output limiting circuit, wherein
the fully differential amplifier circuit includes a first and a second output node,
the fully differential amplifier circuit outputs an amplified noise signal amplified from the noise signal from the first and second output nodes,
the fully differential amplifier circuit outputs an amplified optical signal amplified from the optical signal from the first and second output nodes,
the output limiting circuit is configured to limit the amplitudes of signals output to the first and second output nodes of the fully differential amplifier circuit,
the output limiting circuit limits the amplitude of the amplified noise signal to a first amplitude range, and
the output limiting circuit limits the amplitude of the amplified optical signal to a second amplitude range wider than the first amplitude range.

7. The imaging apparatus according to claim 6, wherein the output limiting circuit includes a first transistor,
the first transistor is connected at one of main nodes thereof to the first output node, and
the first transistor is connected at the other main node thereof to the second output node.

8. The imaging apparatus according to claim 7, wherein
a first voltage is input into a control node of the first transistor during a period of time when the fully differential amplifier circuit outputs the amplified noise signal to limit the amplitude of the amplified noise signal to the first amplitude range, and
a second voltage having a value different from the first voltage is input into the control node of the first transistor during a period of time when the fully differential amplifier circuit outputs the amplified optical signal to limit the amplitude of the amplified optical signal to the second amplitude range.

9. The imaging apparatus according to claim 7, wherein the output limiting circuit further includes a second transistor,
the second transistor is connected at one of main nodes thereof to the first output node,
the second transistor is connected at the other main node thereof to the second output node, a first voltage is input into a control node of the first transistor during a period of time when the fully differential amplifier circuit outputs the amplified noise signal to limit the amplitude of the amplified noise signal to the first amplitude range, and a second voltage having a value different from the first voltage is input into the control node of the second transistor during a period of time when the fully differential amplifier circuit outputs the amplified optical signal to limit the amplitude of the amplified optical signal to the second amplitude range.

10. The imaging apparatus according to claim 9, further comprising:
a first switch between the first transistor and the first output node, and
a second switch between the second transistor and the first output node.

11. The imaging apparatus according to claim 8, further comprising:
a second fully differential amplifier circuit including a first and a second input node; and
a second output limiting circuit configured to limit the amplitude of a signal output by the second fully differential amplifier circuit, wherein
the first input node is connected to the first output node,
the second input node is connected to the second output node,
the second fully differential amplifier circuit includes a third and a fourth output node,
the second output limiting circuit includes a third and a fourth transistor,
the third transistor is connected at one of main nodes thereof to the third output node,
the third transistor is connected at the other main node thereof to the fourth output node,
the fourth transistor is connected at one of main nodes thereof to the third output node,
the fourth transistor is connected at the other main node thereof to the fourth output node,
the second fully differential amplifier circuit outputs a second amplified noise signal amplified from the amplified noise signal from the third and fourth output nodes,
the second fully differential amplifier circuit outputs a second amplified optical signal amplified from the amplified optical signal from the third and fourth output nodes,
a third voltage is input into a control node of the third transistor during a period of time when the second fully differential amplifier circuit outputs the second amplified noise signal to limit the amplitude of the second amplified noise signal, and
a fourth voltage having a value different from the third voltage is input into a control node of the fourth transistor during a period of time when the second fully differential amplifier circuit outputs the second amplified optical signal to limit the amplitude of the second amplified optical signal.

12. The imaging apparatus according to claim 11, wherein the first and third voltages have the same value, and accordingly the amplitude of the second amplified noise signal is limited to the first amplitude range, and
the second and fourth voltages have the same value, and accordingly the amplitude of the second amplified optical signal is limited to the second amplitude range.

13. The imaging apparatus according to claim 6, further comprising a reference pixel configured to output a noise signal, wherein the fully differential amplifier circuit includes a third and a fourth input node,
the third input node is connected to the pixel, and
the fourth input node is connected to the reference pixel.

14. The imaging apparatus according to claim 13, wherein the pixel includes a photodiode configured to generate electric charge by photoelectrically converting light,
the amplifier transistor of the pixel outputs a signal based on the photodiode to the third input node,
the reference pixel includes a capacitor provided instead of the photodiode, and
the amplifier transistor of the reference pixel is connected to the capacitor, and outputs, to the fourth input node, the noise signal as a signal based on the potential of the capacitor.

15. An imaging system comprising:
an imaging apparatus; and
a signal processing unit configured to generate an image by processing a signal output by the imaging apparatus, wherein
the imaging apparatus includes:
a pixel including an amplifier transistor configured to output a noise signal and an optical signal based on light;
an amplification circuit into which the noise signal and the optical signal are input from the amplifier transistor, the amplification circuit including a first and a second amplifier circuit; and
a limiter circuit connected to an output node of the first amplifier circuit,
the first amplifier circuit outputs, to the second amplifier circuit, a first reference signal amplified from the noise signal, and a first optical signal amplified from the optical signal,
the second amplifier circuit includes a capacitive element and an amplifier,
the limiter circuit limits the amplitude of the first reference signal output by the first amplifier circuit,
the capacitive element is provided on an electric path between the limiter circuit and an input node of the amplifier, and
the capacitive element clamps the first reference signal whose amplitude is limited by the limiter circuit.

16. An imaging apparatus comprising:
an imaging apparatus; and
a signal processing unit configured to generate an image by processing a signal output by the imaging apparatus, wherein
the imaging apparatus includes:
a pixel including an amplifier transistor configured to output a noise signal and an optical signal based on light;
a fully differential amplifier circuit into which the optical signal is input from the amplifier transistor; and
an output limiting circuit,
the fully differential amplifier circuit includes a first and a second output node,
the fully differential amplifier circuit outputs an amplified noise signal amplified from the noise signal from the first and second output nodes,
the fully differential amplifier circuit outputs an amplified optical signal amplified from the optical signal from the first and second output nodes,
the output limiting circuit is configured to limit the amplitudes of signals output to the first and second output nodes of the fully differential amplifier circuit, the output limiting circuit limits the amplitude of the amplified noise signal to a first amplitude range, and the output limiting circuit limits the amplitude of the amplified optical signal to a second amplitude range wider than the first amplitude range.

\* \* \* \* \*